(12) United States Patent
Nakajima

(10) Patent No.: US 12,436,041 B2
(45) Date of Patent: Oct. 7, 2025

(54) SEMICONDUCTOR DEVICE AND PHYSICAL QUANTITY SENSOR DEVICE

(71) Applicant: FUJI ELECTRIC CO., LTD., Kawasaki (JP)

(72) Inventor: Hiroyuki Nakajima, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 509 days.

(21) Appl. No.: 17/994,063

(22) Filed: Nov. 25, 2022

(65) Prior Publication Data

US 2023/0236071 A1    Jul. 27, 2023

(30) Foreign Application Priority Data

Jan. 21, 2022 (JP) .................. 2022-007967
May 25, 2022 (JP) .................. 2022-085476

(51) Int. Cl.
| | |
|---|---|
| *G01K 7/24* | (2006.01) |
| *G01K 13/00* | (2021.01) |
| *H03M 1/06* | (2006.01) |
| *H03M 1/12* | (2006.01) |

(52) U.S. Cl.
CPC .............. *G01K 7/24* (2013.01); *G01K 13/00* (2013.01); *G01K 2219/00* (2013.01); *H03M 1/06* (2013.01); *H03M 1/12* (2013.01)

(58) Field of Classification Search
CPC ............ G01K 7/24; G01K 7/22; G01K 13/00; H03M 1/78; H03M 1/06
See application file for complete search history.

(56) References Cited

U.S. PATENT DOCUMENTS 6,681,135 B1 * 1/2004 Davis .................. A61N 1/3655
607/30

FOREIGN PATENT DOCUMENTS

| JP | H04-109132 A | 4/1992 |
|---|---|---|
| JP | 2016-111501 A | 6/2016 |
| JP | 2018-119972 A | 8/2018 |

* cited by examiner

*Primary Examiner* — Joseph J Lauture
(74) *Attorney, Agent, or Firm* — Rabin & Berdo, P.C.

(57) ABSTRACT

A semiconductor device, including: a thermistor for temperature detection; a series resistor selection circuit including a series resistor group connected in series with the thermistor, the series resistor selection circuit being configured to select a series resistor from the series resistor group according to a selection signal; an analog/digital (A/D) converter that performs A/D conversion on a divided voltage obtained by dividing an internal power supply voltage between the thermistor and the selected series resistor to generate divided voltage data, and outputs the divided voltage data; and a control circuit. The control circuit, during a period of selecting the series resistor, controls the A/D converter to operate in a low bit count mode, such that the selected series resistor causes the divided voltage data to fall within a predetermined voltage range, and controls the A/D converter to operate in a high bit count mode after selecting the series resistor.

19 Claims, 20 Drawing Sheets

SEMICONDUCTOR DEVICE AND PHYSICAL QUANTITY SENSOR DEVICE

CROSS-REFERENCE TO RELATED APPLICATIONS

This application is based upon and claims the benefits of priority of the prior Japanese Patent Application No. 2022-007967, filed on Jan. 21, 2022, and the Japanese Patent Application No. 2022-085476, filed on May 25, 2022, the entire contents of which are incorporated herein by reference.

BACKGROUND OF THE INVENTION

1. Field of the Invention

The embodiment discussed herein relates to a semiconductor device for detecting a temperature and a physical quantity sensor device for detecting a temperature-dependent physical quantity.

2. Background of the Related Art

Highly reliable in-vehicle electronic devices that are able to adapt to environmental changes are demanded. Hence, there is an increasing importance of a technique of detecting a physical quantity such as a temperature with a sensor, communicating the detection result using an automotive communication protocol, and controlling a control target according to environmental changes.

FIG. 17 illustrates the configuration of a conventional temperature sensor device. The temperature sensor device 100 detects a temperature and sends the detected temperature information to a control device using the single edge nibble transmission (SENT) protocol, which is one of the automotive communication protocols.

The temperature sensor device 100 includes a power supply terminal VCC, a reference power supply terminal VSS, an output terminal SENT, and a thermistor connection terminal THERM. The temperature sensor device 100 also includes an internal power supply generation circuit 101, a digital circuit 102, an output circuit 103, a digital circuit power supply generation circuit 111, and a resistor R10. The digital circuit 102 includes an analog/digital (A/D) converter 102a. The A/D converter 102a includes both an analog circuit and a digital circuit. Therefore, the analog circuit of the A/D converter 102a is supplied with an internal power supply voltage generated by the internal power supply generation circuit 101.

The internal power supply generation circuit 101 generates the internal power supply voltage from a power supply voltage input to the power supply terminal VCC, and supplies the internal power supply voltage to components of the device. The digital circuit power supply generation circuit 111 generates a power supply voltage to be supplied to the digital circuit 102, from the internal power supply voltage. The reference power supply terminal VSS is connected to a reference power supply voltage such as the ground (GND), and the reference power supply voltage is connected to the digital circuit 102, the terminal VL of the A/D converter 102a, and the output circuit 103 in the device.

A negative temperature coefficient (NTC) thermistor Rt is connected as an external component to the thermistor connection terminal THERM and reference power supply terminal VSS, and the resistor R10 in the device is connected in series with the NTC thermistor Rt. Then, the internal power supply voltage is input to one end of the resistor R10 and is divided between the NTC thermistor Rt and the resistor R10 to thereby generate a divided voltage, which is then input to a terminal VIN of the A/D converter 102a.

A reference voltage VREF generated from the internal power supply voltage is input to a terminal VH of the A/D converter 102a, and a clock signal AD-CLK generated in the digital circuit 102 is input to the A/D converter 102a.

The A/D converter 102a converts the analog divided voltage received at the terminal VIN, which indicates temperature information, into a digital value in synchronization with the clock signal AD-CLK and sends the obtained digital value to the output circuit 103. The output circuit 103 converts the received digital value into the SENT protocol format and transmits the obtained temperature data to a predetermined control device.

As related techniques, for example, there has been proposed a technique of performing communication between a physical quantity sensor and a control device using an automotive communication protocol (see, for example, Japanese Laid-open Patent Publication No. 2016-111501). Further, there has been proposed a technique of adjusting the characteristics of a physical quantity according to adjustment information (see, for example, Japanese Laid-open Patent Publication No. 2018-119972). Still further, there has been proposed a technique of providing a variable resistor means whose resistance value changes according to a control signal, and obtaining a divided voltage value on the basis of the variably controlled resistance value of the variable resistor means and an equivalent resistance value of a thermistor (see, for example, Japanese Laid-open Patent Publication No. 04-109132).

FIG. 18 illustrates the temperature dependence of an NTC thermistor. The vertical axis represents resistance value (kΩ), whereas the horizontal axis represents temperature (C). A thermistor is a resistive element which has a high temperature coefficient and whose resistance value k0 changes according to temperature. Especially, the NTC thermistor is a resistive element whose resistance value k0 decreases as the temperature increases.

FIG. 19 illustrates an example of a circuit using an NTC thermistor. A typical circuit using an NTC thermistor Rt is a circuit that generates a divided voltage by resistance-dividing a power supply voltage between a resistor R10 and the NTC thermistor Rt.

Since the resistance value of the NTC thermistor Rt changes sensitively to temperature changes, the divided voltage generated by the NTC thermistor Rt and resistor R10 also changes according to the temperature changes. Hence, a temperature is detectable based on changes in the divided voltage. In this connection, in such a circuit, it is important that the resistor R10 connected to the NTC thermistor Rt has a resistance value such that a divided voltage is output in a desired temperature range of a measurement target.

FIG. 20 illustrates the temperature dependence of divided voltage. The vertical axis represents divided voltage (V), whereas the horizontal axis represents temperature (° C.). As the ambient temperature of the NTC thermistor Rt increases, the resistance value of the NTC thermistor Rt decreases, and the divided voltage drops accordingly.

However, in the case where a temperature range of a measurement target is wide, the temperature dependence of divided voltage is saturated at both ends of the temperature range. Hence, the divided voltage changes less in temperature change ranges H1 and H3 at both ends of the temperature range than in a temperature change range H2 at the middle of the temperature range. Hence, the temperature measurement accuracy decreases in the temperature change ranges H1 and H3.

More specifically, since the temperature dependence is saturated in the temperature change ranges H1 and H3, the slope of the divided voltage is small and gentle, which leads to a low accuracy of temperature measurement. On the other hand, since the temperature dependence is not saturated in the temperature change range H2, the slope of the divided voltage is large and steep, which leads to a high accuracy of temperature measurement.

To address this problem, it is considerable to adjust the resistance value of the series resistor R10 connected in series with the NTC thermistor Rt according to the temperature range of a measurement target. For example, the above-mentioned Japanese Laid-open Patent Publication No. 04-109132 teaches using a switched capacitor to make the resistance value of a series resistor variable and selecting a predetermined resistance value.

However, in the technique taught in Japanese Laid-open Patent Publication No. 04-109132, a divided voltage is converted to a digital value by an A/D converter, and the obtained digital value is compared with values stored in a table to select a resistance value. In the case where the A/D converter is a high-bit A/D converter with high resolution, it takes long A/D conversion time. For this reason, it would take long time to select an appropriate resistance value while changing the resistance value of the series resistor and to obtain a final divided voltage.

Especially, successive approximation register (SAR) type A/D converters and delta-sigma ($\Delta\Sigma$) type A/D converters have high resolution, but they take long A/D conversion time. Hence, the above-described selective control of a resistance value may cause a risk of failing to obtain correct temperature data in time within the entire process.

SUMMARY OF THE INVENTION

According to one aspect, there is provided a semiconductor device, including: a thermistor for temperature detection; a series resistor selection circuit including a series resistor group that is connected in series with the thermistor, the series resistor selection circuit being configured to select a series resistor from the series resistor group according to a selection signal; an analog/digital (A/D) converter that performs A/D conversion on a divided voltage obtained by dividing an internal power supply voltage between the thermistor and the selected series resistor to generate divided voltage data, and outputs the divided voltage data; and a control circuit that during a period of selecting the series resistor, controls the A/D converter to operate in a low bit count mode, such that the selected series resistor causes the divided voltage data to fall within a predetermined voltage range, and controls the A/D converter to operate in a high bit count mode after selecting the series resistor.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
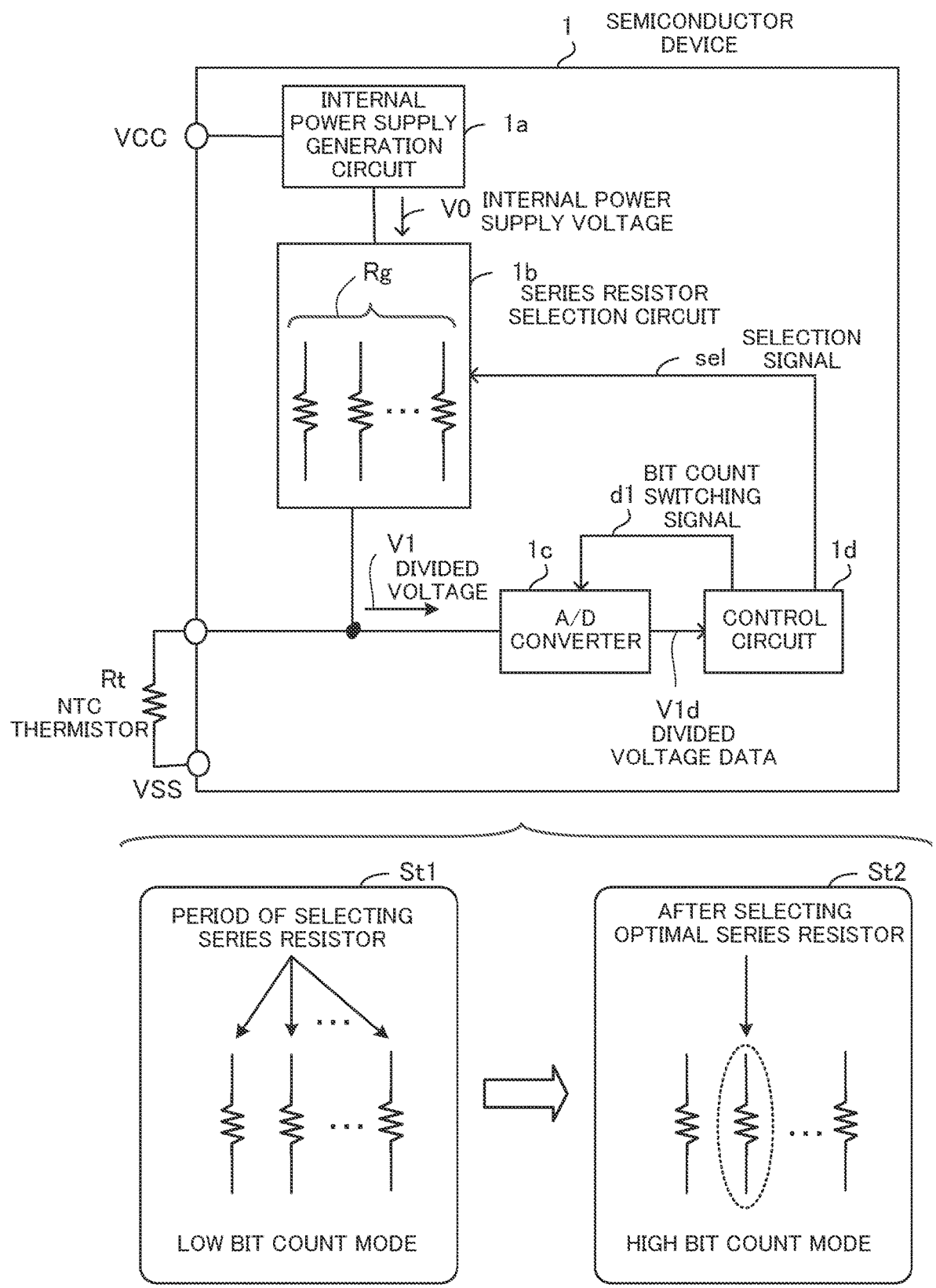
FIG. 1 is a view for describing a semiconductor device according to one embodiment.

Hereinafter, an embodiment will be described with reference to the accompanying drawings. In this connection, the same reference numerals are given to substantially identical components in the description and drawings, and duplicate description of such components may be omitted.

FIG. 1 is a view for describing a semiconductor device according to one embodiment. The semiconductor device 1 includes a thermistor (hereinafter, referred to as a negative temperature coefficient (NTC) thermistor) Rt for temperature detection, an internal power supply generation circuit 1a, a series resistor selection circuit 1b, an analog/digital (hereinafter, referred to as A/D) converter 1c, and a control circuit 1d. In this connection, the NTC thermistor Rt may be provided inside the device. In addition, the A/D converter 1c may be provided inside the control circuit 1d.

A power supply voltage is input to a power supply terminal VCC of the semiconductor device 1, and the internal power supply generation circuit 1a generates an internal power supply voltage V0 from the power supply voltage. A reference power supply voltage is connected to a reference power supply terminal VSS of the semiconductor device 1.

The series resistor selection circuit 1b includes a series resistor group Rg that is connected in series with the NTC thermistor Rt, and selects a series resistor from the series resistor group Rg according to a selection signal sel. The A/D converter 1c performs A/D conversion of a divided voltage V1 obtained by dividing the internal power supply voltage V0 between the NTC thermistor Rt and the series resistor selected in the series resistor selection circuit 1b, and outputs divided voltage data V1d corresponding to temperature information. The A/D converter 1c is a successive approximation register (SAR) type A/D converter or ΔΣ type A/D converter, for example.

During a period of selecting a series resistor from the series resistor group Rg, the control circuit 1d outputs a bit count switching signal d1 to control the A/D converter 1c to operate with low resolution in a low bit count mode, and outputs the selection signal sel to sequentially change a series resistor until divided voltage data V1d falls within a predetermined voltage range (state St1).

After selecting a series resistor (an optimal series resistor) such that divided voltage data Vid falls within the predetermined voltage range, the control circuit 1d outputs the bit count switching signal d1 to control the A/D converter 1c to operate with high resolution in a high bit count mode (state St2).

As described above, the semiconductor device 1 controls the A/D converter 1c to operate in the low bit count mode during the period of selecting a series resistor to be connected to the NTC thermistor Rt. Then, after selecting an optimal series resistor, the semiconductor device 1 controls the A/D converter 1c to operate in the high bit count mode. In this connection, it is needless to say that the SAR type A/D converter and ΔΣ type A/D converter take longer conversion time as they operate with a higher bit count.

The above approach makes it possible to reduce time to select a series resistor with an optimal resistance value from the series resistors that are connected to the NTC thermistor Rt, and also to improve the measurement accuracy by obtaining divided voltage data V1d corresponding to temperature information using the resistance value of the selected series resistor.

(Configuration of Semiconductor Device)

Figure 2:
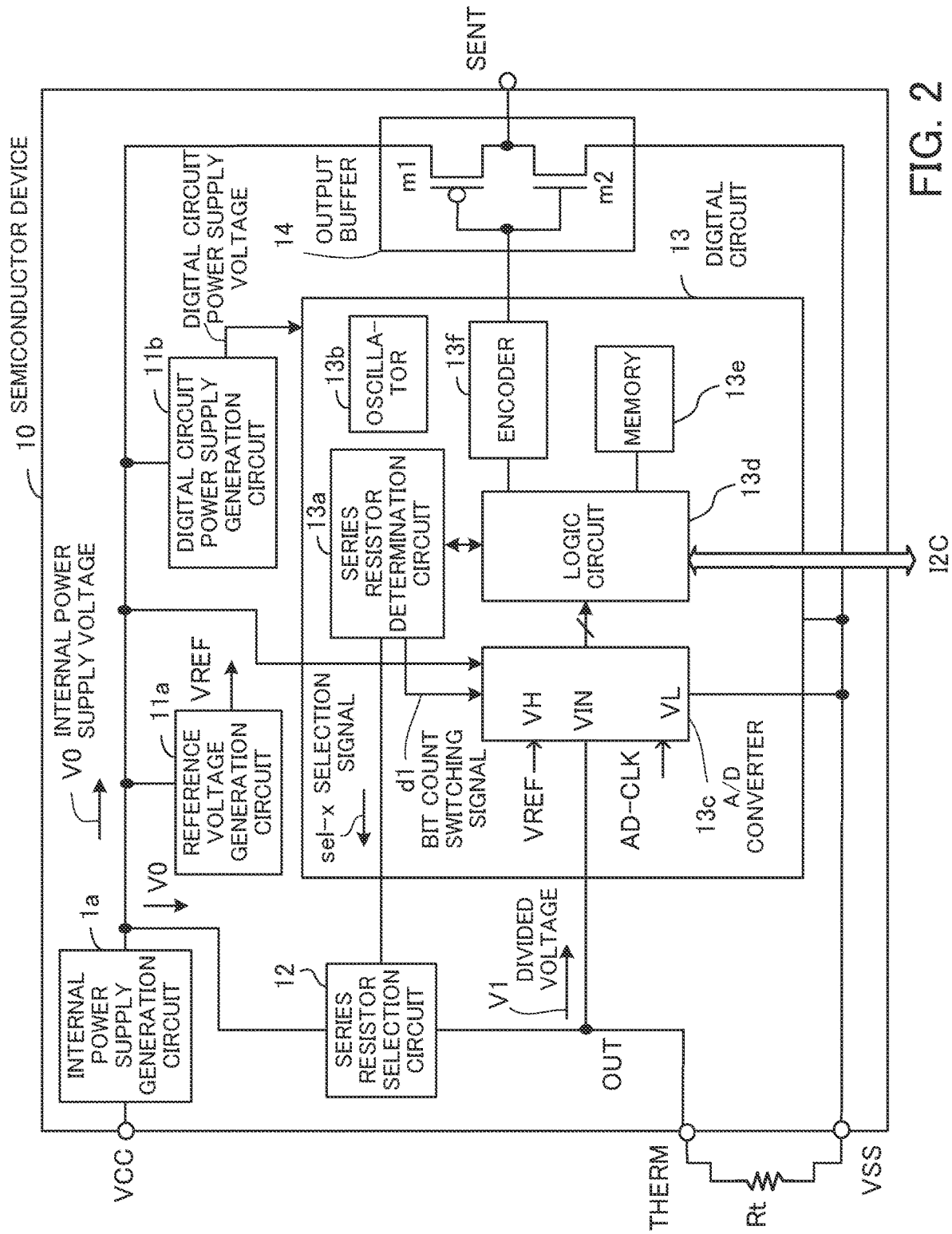
FIG. 2 illustrates an example of configuration of a semiconductor device.

The following describes the configuration and operation of a semiconductor device according to the present embodiment in detail. FIG. 2 illustrates an example of the configuration of the semiconductor device. The semiconductor device 10 detects a temperature and transmits the detected temperature information to a control device using the single edge nibble transmission (SENT) protocol. In this connection, other than the SENT protocol, the peripheral sensor interface 5 (PSI5) or distributed system interface (DSI) may be used as an automotive communication protocol. In addition, the control device is an electronic control unit (ECU), for example.

The semiconductor device 10 includes a power supply terminal VCC, a reference power supply terminal VSS, an output terminal SENT, and a thermistor connection terminal THERM, and also includes an internal power supply generation circuit 1a that is connected to the power supply terminal VCC and generates an internal power supply voltage, a reference voltage generation circuit 11a that generates a reference voltage from the internal power supply voltage V0 that is an output of the internal power supply generation circuit 1a, and a digital circuit power supply generation circuit 11b that generates a power supply voltage for a digital circuit from the internal power supply voltage V0.

In addition, the semiconductor device 10 includes a series resistor selection circuit 12, a digital circuit 13, and an output buffer 14. The digital circuit 13 has the function of the control circuit 1d of FIG. 1, and includes a series resistor determination circuit 13a, an oscillator 13b, an A/D converter 13c, a logic circuit 13d, a memory 13e, and an encoder 13f. In this connection, the series resistor determination circuit 13a may be provided inside the logic circuit 13d. In addition, the A/D converter 13c includes both an analog circuit and a digital circuit. Therefore, the A/D converter 13c is supplied with the internal power supply voltage V0 as a power supply for the analog circuit provided therein.

The internal power supply generation circuit 1a is connected to the power supply terminal VCC. The reference power supply terminal VSS is connected to a reference power supply voltage such as the ground (GND), and the reference power supply voltage is connected to the digital circuit 13, a terminal VL of the A/D converter 13c, and the output buffer 14 that are provided inside the device.

The internal power supply generation circuit 1a protects the circuits provided inside the device from breakage due to a surge of power supply voltage applied from the power supply terminal VCC, and also generates the internal power supply voltage V0 from the power supply voltage and supplies the internal power supply voltage V0 to the series resistor selection circuit 12, reference voltage generation circuit 11a, digital circuit power supply generation circuit 11b, A/D converter 13c, and output buffer 14.

The reference voltage generation circuit 11a generates a reference voltage VREF from the internal power supply voltage V0 and supplies the reference voltage VREF to the A/D converter 13c. The digital circuit power supply generation circuit 11b generates a digital circuit power supply voltage from the internal power supply voltage V0 and supplies the digital circuit power supply voltage to the digital circuit 13.

An NTC thermistor Rt is connected as an external component to the thermistor connection terminal THERM and reference power supply terminal VSS. One end of the NTC thermistor Rt is connected via the thermistor connection terminal THERM to the series resistor selection circuit 12 and a terminal VIN of the A/D converter 13c.

The series resistor determination circuit 13a sends selection signals sel-x (x=0, 1, 2, . . . ) for selecting a series resistor to the series resistor selection circuit 12. The series resistor selection circuit 12 includes a series resistor group including a plurality of series resistors, and selects a series resistor to be connected to the NTC thermistor Rt from the series resistor group according to the selection signals sel-x. The oscillator 13b oscillates a reference clock and a clock signal AD-CLK synchronized with the reference clock.

The A/D converter 13c receives the reference voltage VREF at a terminal VH thereof and a divided voltage V1 at the terminal VIN thereof. For example, the A/D converter 13c is an SAR type A/D converter or ΔΣ type A/D converter, for example, and converts the analog divided voltage V1 received at the terminal VIN to temperature data that is digital divided voltage data in synchronization with the clock signal AD-CLK, and sends the temperature data to the logic circuit 13d.

The logic circuit 13d operates in synchronization with the reference clock, performs a correction operation of data output from the A/D converter 13c on the basis of various characteristics parameter values and correction coefficients stored in the memory 13e, and outputs the resultant to the encoder 13f. In addition, the logic circuit 13d performs communication via an access port, not illustrated, using a communication protocol, for example, the inter integrated circuit (I2C) protocol.

For example, the logic circuit 13d is connected to a test terminal via I2C, and is able to perform rewrite and other operations of the parameter values and correction coefficients stored in the memory 13e on the basis of data in the I2C format sent from the test terminal.

The encoder 13f converts the temperature data into a SENT protocol format and sends the resultant to the output buffer 14. The output buffer 14 includes a PMOS transistor m1 that is a P-channel metal-oxide-semiconductor field-effect transistor (MOSFET), and an NMOS transistor m2 that is an N-channel MOSFET.

The gate of the PMOS transistor m1 is connected to the gate of the NMOS transistor m2 and the output terminal of the encoder 13f. The source of the PMOS transistor m1 receives the internal power supply voltage V0, and the source of the NMOS transistor m2 is connected to the reference power supply terminal VSS.

The drain of the PMOS transistor m1 is connected to the drain of the NMOS transistor m2 and the output terminal SENT. The output buffer 14 configured as above buffers the temperature data output from the encoder 13f and outputs the temperature data to the control device via the output terminal SENT.

(Configuration of Series Resistor Selection Circuit)

Figure 3:
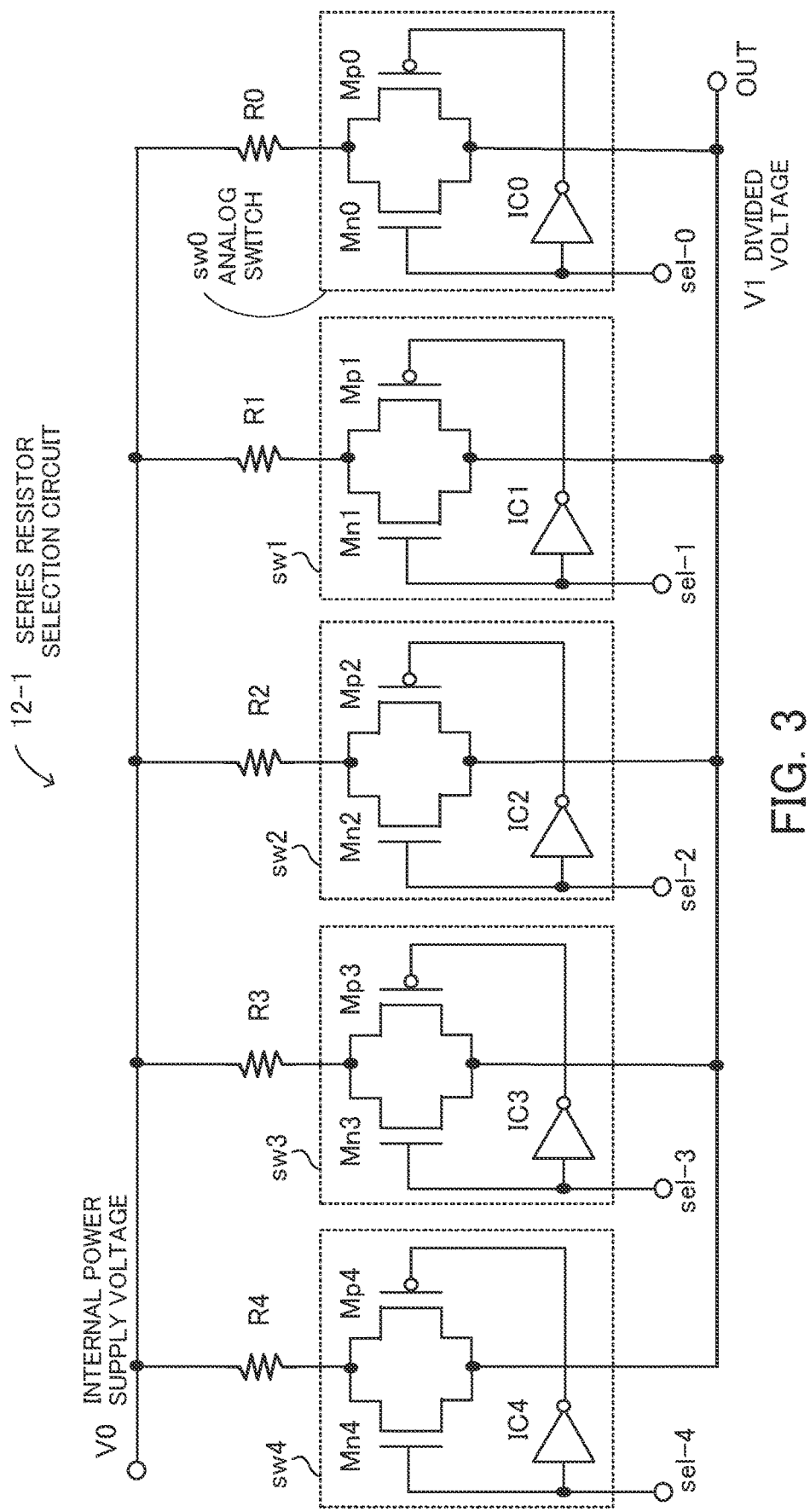
FIG. 3 illustrates an example of the configuration of a series resistor selection circuit.

FIG. 3 illustrates an example of the configuration of a series resistor selection circuit. The series resistor selection circuit 12-1 includes resistors R0, . . . , R4 and analog switches sw0, . . . , sw4. The resistors R0, . . . , R4 are series resistors that are connectable to the NTC thermistor Rt and have different resistance values.

The analog switch sw0 includes a PMOS transistor Mp0, an NMOS transistor Mn0, and an inverter IC0, and the analog switch sw1 includes a PMOS transistor Mp1, an NMOS transistor Mn1, and an inverter IC1. The analog switch sw2 includes a PMOS transistor Mp2, an NMOS transistor Mn2, and an inverter IC2.

Similarly, the analog switch sw3 includes a PMOS transistor Mp3, an NMOS transistor Mn3, and an inverter IC3, and the analog switch sw4 includes a PMOS transistor Mp4, an NMOS transistor Mn4, and an inverter IC4.

The following describes the connection relationship between these components. One end of the resistor R0 is connected to one end of each of the resistors R1, . . . , R4. Each resistor R0, . . . , R4 receives an internal power supply voltage V0 at its one end. The other end of the resistor R0 is connected to the source of the PMOS transistor Mp0 and the drain of the NMOS transistor Mn0. The gate of the NMOS transistor Mn0 is connected to the input terminal of the inverter IC0, and the gate of the PMOS transistor Mp0 is connected to the output terminal of the inverter IC0. In addition, a selection signal sel-0 output from the series resistor determination circuit 13a is input to the gate of the NMOS transistor Mn0 and the input terminal of the inverter IC0.

The other terminal of the resistor R1 is connected to the source of the PMOS transistor Mp1 and the drain of the NMOS transistor Mn1. The gate of the NMOS transistor Mn1 is connected to the input terminal of the inverter IC1, and the gate of the PMOS transistor Mp1 is connected to the output terminal of the inverter IC1. In addition, a selection signal sel-1 output from the series resistor determination circuit 13a is input to the gate of the NMOS transistor Mn1 and the input terminal of the inverter IC1.

The other terminal of the resistor R2 is connected to the source of the PMOS transistor Mp2 and the drain of the NMOS transistor Mn2. The gate of the NMOS transistor Mn2 is connected to the input terminal of the inverter IC2, and the gate of the PMOS transistor Mp2 is connected to the output terminal of the inverter IC2. In addition, a selection signal sel-2 output from the series resistor determination circuit 13a is input to the gate of the NMOS transistor Mn2 and the input terminal of the inverter IC2.

The other terminal of the resistor R3 is connected to the source of the PMOS transistor Mp3 and the drain of the NMOS transistor Mn3. The gate of the NMOS transistor Mn3 is connected to the input terminal of the inverter IC3, and the gate of the PMOS transistor Mp3 is connected to the output terminal of the inverter IC3. In addition, a selection signal sel-3 output from the series resistor determination circuit 13a is input to the gate of the NMOS transistor Mn3 and the input terminal of the inverter IC3.

The other terminal of the resistor R4 is connected to the source of the PMOS transistor Mp4 and the drain of the NMOS transistor Mn4. The gate of the NMOS transistor Mn4 is connected to the input terminal of the inverter IC4, and the gate of the PMOS transistor Mp4 is connected to the output terminal of the inverter IC4. In addition, a selection signal sel-4 output from the series resistor determination circuit 13a is input to the gate of the NMOS transistor Mn4 and the input terminal of the inverter IC4.

In addition, a node OUT is connected to the drain of the PMOS transistor Mp0 and the source of the NMOS transistor Mn0, to the drain of the PMOS transistor Mp1 and the source of the NMOS transistor Mn1, and to the drain of the PMOS transistor Mp2 and the source of the NMOS transistor Mn2.

The node OUT is also connected to the drain of the PMOS transistor Mp3 and the source of the NMOS transistor Mn3 and to the drain of the PMOS transistor Mp4 and the source of the NMOS transistor Mn4. A divided voltage V1 is output from the node OUT.

Using the plurality of series resistors R0, . . . , R4 are prepared as described above, it becomes possible to select one series resistor from the series resistors R0, . . . , R4 by turning on the corresponding one of the analog switches Sw0, . . . , sw4 according to the selection signals sel-x (x=0, . . . , 4).

For example, by setting the selection signal sel-4 to H level and the selection signals sel-0, . . . , sel-3 to L level, the resistor R4 is selected and is electrically connected to the NTC thermistor Rt. In this case, a divided voltage V1 obtained by dividing the internal power supply voltage V0 between the NTC thermistor Rt and the resistor R4 is output from the node OUT.

Figure 4:
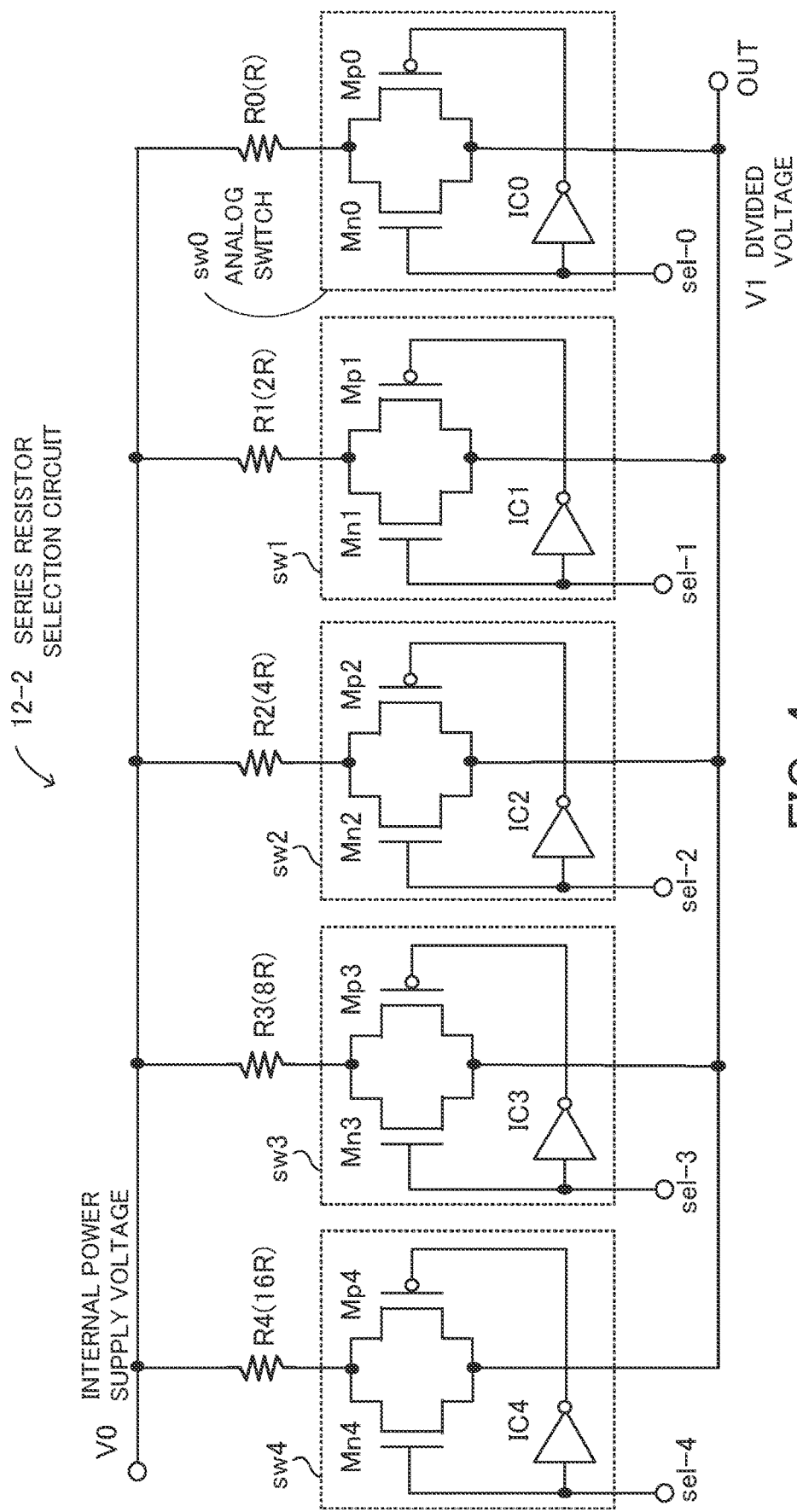
FIG. 4 illustrates an example of the configuration of a series resistor selection circuit.

FIG. 4 illustrates an example of the configuration of a series resistor selection circuit. The basic configuration of the series resistor selection circuit 12-2 is the same as that of the series resistor selection circuit 12-1 illustrated in FIG. 3. What is different from the series resistor selection circuit 12-1 is that the resistors R1, . . . , R4 among the resistors R0, . . . , R4 are weighted with the resistance value of the resistor R0 as a reference.

In addition, FIG. 3 illustrates the configuration in which only one selection signal sel-x is set to H level to select one resistor. By contrast, FIG. 4 illustrates the configuration in which one or a plurality of selection signals sel-x may be set to H level to select one or a plurality of resistors.

For example, taking the resistance value of the resistor R0 as R, the resistance value of the resistor R1 is set to twice R, i.e., 2R, the resistance value of the resistor R2 is set to $2^2R$, i.e., 4R, the resistance value of the resistor R3 is set to $2^3R$, i.e., 8R, and the resistance value of the resistor R4 is set to $2^4R$, i.e., 16R.

In addition, by setting the selection signals sel-0 and sel-1 to H level and the selection signals sel-2, sel-3, and sel-4 to L level, a combined resistor of the resistors R0 and R1 is selected. This configuration makes it possible to set more equally spaced and more subdivided resistance values than the configuration of FIG. 3, for the resistance value of a series resistor to be connected to the NTC thermistor Rt.

(Temperature Dependence of Divided Voltage for Each Series Resistor)

Figure 5:
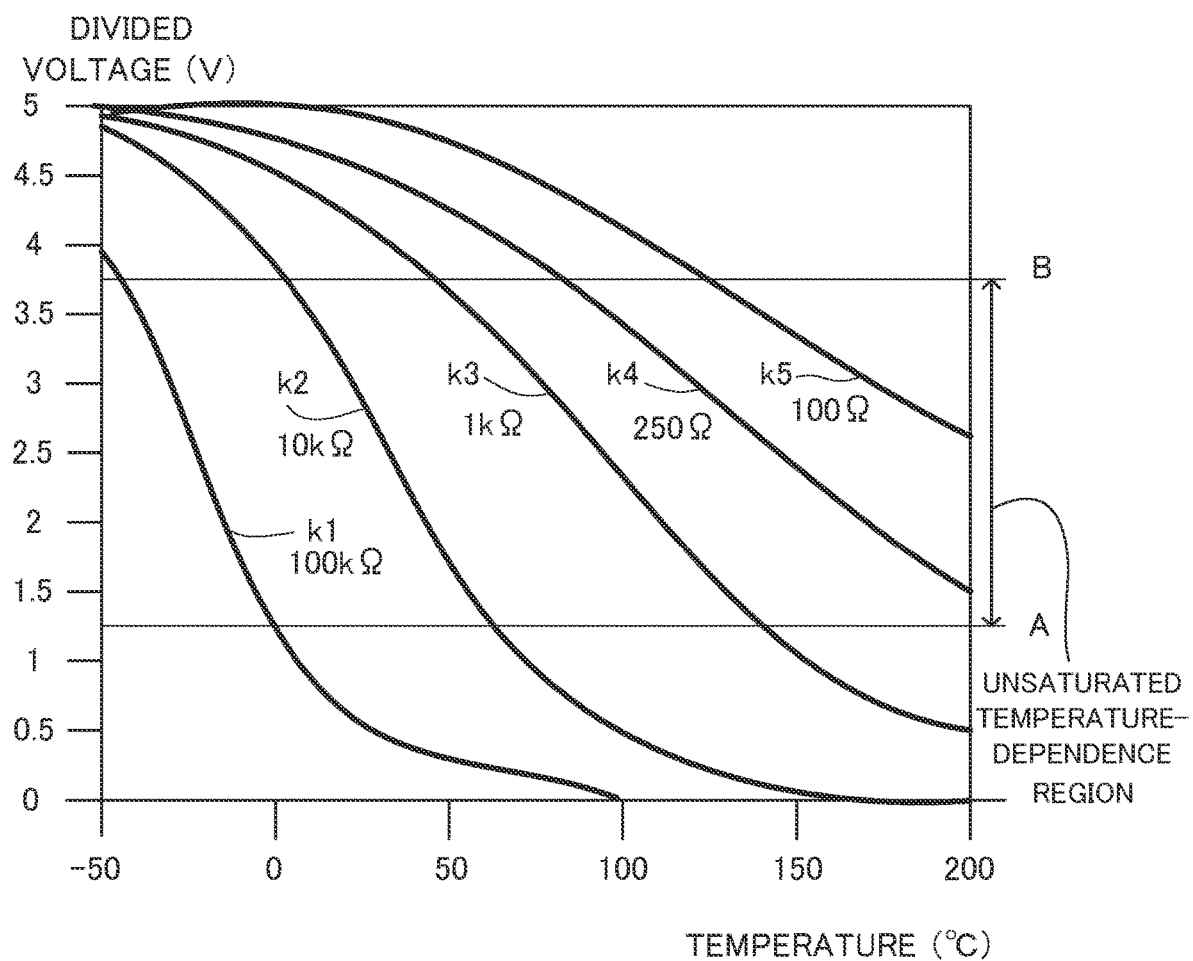
FIG. 5 illustrates the temperature dependence of divided voltage for each series resistor.

FIG. 5 illustrates the temperature dependence of divided voltage for each series resistor. The vertical axis represents divided voltage (V), whereas the horizontal axis represents temperature (C). The graphs k1, . . . , k5 represent the temperature dependence (divided-voltage temperature dependence) of divided voltage with respect to series resistors with resistance values of 100Ω, 10Ω, 1Ω, 250Ω, and 100Ω, respectively.

In a divided voltage range from a threshold A to a threshold B (hereinafter, this range may be referred to as an unsaturated temperature-dependence region), a divided voltage greatly changes when the temperature changes. This is because the temperature dependence of divided voltage is not saturated. Hence, by selecting a series resistor whose resistance value is such as to generate a divided voltage falling within the unsaturated temperature-dependence region between the threshold A and the threshold B in a temperature range of a measurement target, the temperature measurement accuracy will be improved.

(Operation of Series Resistor Determination Circuit)

Figure 6:
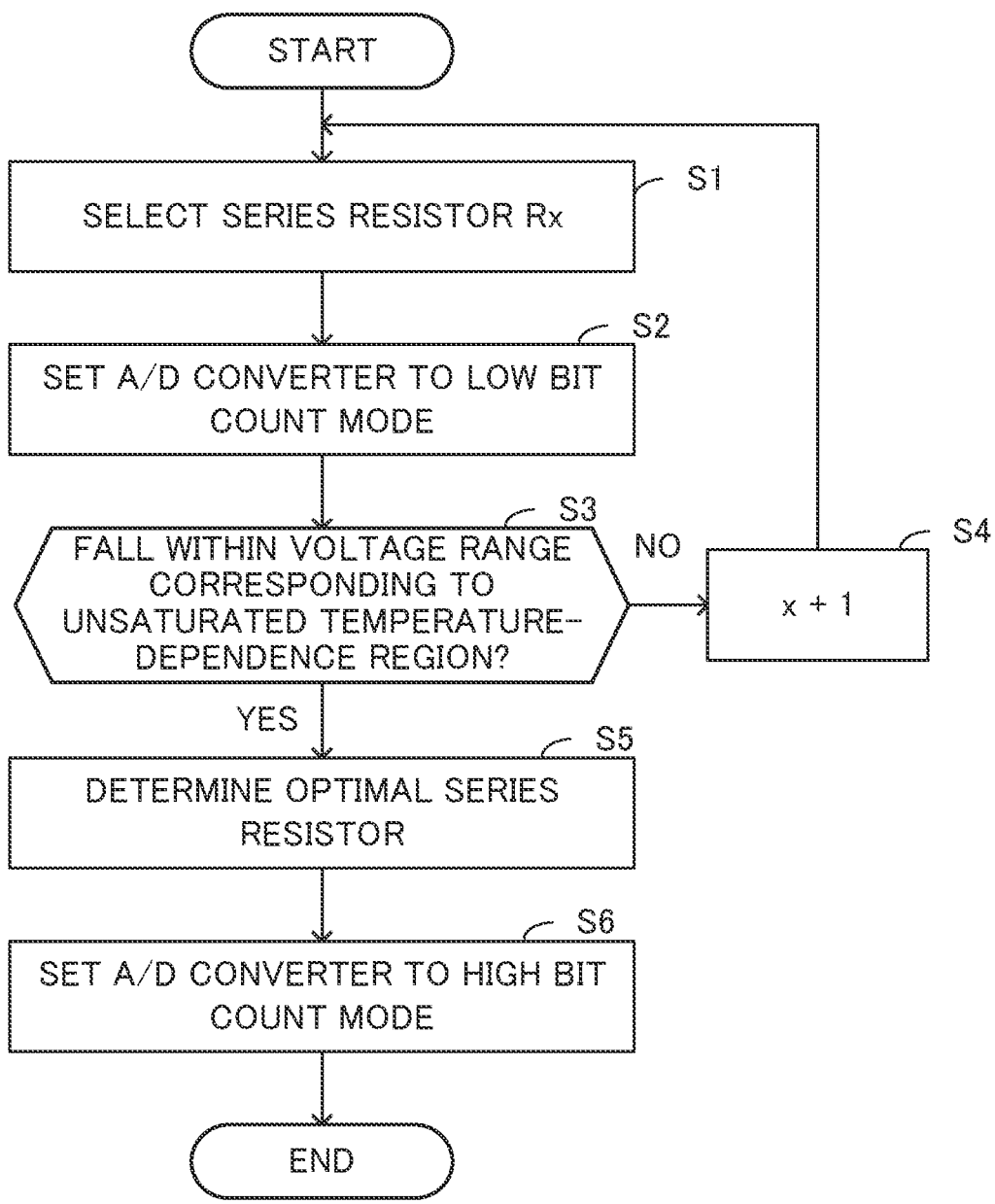
FIG. 6 is a flowchart illustrating the operation of a series resistor determination circuit.

FIG. 6 is a flowchart illustrating the operation of a series resistor determination circuit.

(Step S1) The series resistor determination circuit 13a sends a selection signal sel-x for selecting a series resistor Rx from the plurality of series resistors included in the series resistor selection circuit 12, to the series resistor selection circuit 12.

(Step S2) The series resistor determination circuit 13a sends a bit count switching signal d1 to the A/D converter 13c to set the bit count mode of the A/D converter 13c to a low bit count mode (for example, a two-bit count mode).

(Step S3) The series resistor determination circuit 13a determines whether temperature data obtained by performing A/D conversion of a divided voltage V1 falls within a voltage range corresponding to the unsaturated temperature-dependence region between the threshold A and the threshold B. If the temperature data does not fall within the voltage range corresponding to the unsaturated temperature-dependence region, the process proceeds to step S4. If the temperature data falls within the voltage range corresponding to the unsaturated temperature-dependence region, the process proceeds to step S5.

(Step S4) The series resistor determination circuit 13a increments x to generate a selection signal sel-(x+1) for selecting a new series resistor R(x+1) and outputs the selection signal sel-(x+1). The process proceeds back to step S1.

(Step S5) The series resistor determination circuit 13a determines that the selected series resistor is an optimal series resistor.

(Step S6) The series resistor determination circuit 13a sends the bit count switching signal d1 to the A/D converter 13c to set the bit count mode of the A/D converter 13c to the usual high bit count mode (for example, a 12-bit count mode).

As described above, during the period of selecting a series resistor to be connected to the NTC thermistor Rt, the series resistor determination circuit 13a controls the A/D converter 13c to operate at high speed in the low bit count mode, and makes a determination to select an optimal series resistor while sequentially changing a selected series resistor in the series resistor selection circuit 12.

In this case, each time changing the selected series resistor, the A/D converter 13c performs, in the low bit count mode, A/D conversion of a divided voltage V1 output selection circuit 12, and from the series resistor determines whether the digital converted value (temperature data) falls within the voltage range between the threshold A and the threshold B.

By appropriately selecting a series resistor on the basis of the predetermined voltage range, a region with high temperature dependence (leading to a high accuracy) of divided voltage, as illustrated in FIG. 5, comes into use. In addition, the threshold A and threshold B are set to appropriate values for selecting a series resistor. When making a determination to select a series resistor, the A/D converter is set to a low bit count mode, like a two-bit or three-bit count mode, to perform fast A/D conversion.

Thus, it is possible to complete the selection of a series resistor in short time. Then, after an optimal series resistor is selected, A/D conversion is performed in the original high bit count mode. As a result, temperature data is obtained with high accuracy.

(Physical Quantity Sensor Device)

The following describes the case where the semiconductor device 1 and 10 of the present embodiment is applied to a physical quantity sensor device. In this connection, the same reference numerals as already used are given to the corresponding components, and the description of these components may be omitted.

Figure 7:
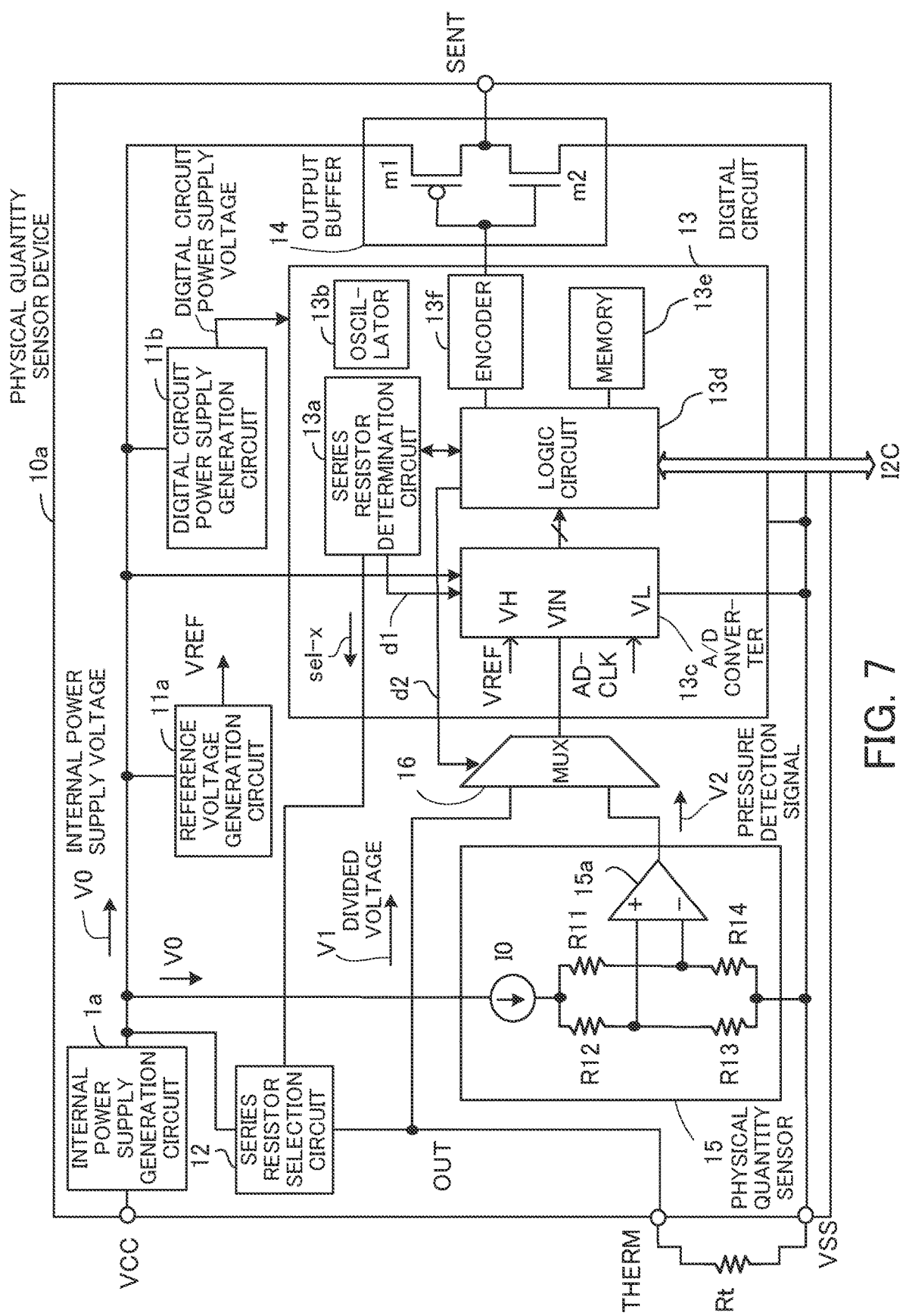
FIG. 7 illustrates an example of the configuration of a physical quantity sensor device.

FIG. 7 illustrates an example of the configuration of a physical quantity sensor device. As new components that the semiconductor device 10 does not include, the physical quantity sensor device 10a includes a physical quantity sensor 15 and a multiplexer (MUX) 16. The other components of the physical quantity sensor device 10a are the same as those of the semiconductor device 10.

The physical quantity sensor 15 includes a constant current supply I0, resistors R11, . . . , R14, and an operational amplifier 15a. An internal power supply voltage V0 is input to the input terminal of the constant current supply I0, and the output terminal of the constant current supply I0 is connected to one terminal of the resistor R11 and one terminal of the resistor R12. The other terminal of the resistor R11 is connected to one terminal of the resistor R14 and the inverting terminal of the operational amplifier 15a. The other terminal of the resistor R12 is connected to one end of the resistor R13 and the non-inverting terminal of the operational amplifier 15a. The other terminal of the resistor R13 and the other terminal of the resistor R14 are connected to a reference power supply terminal VSS.

A divided voltage V1 is input to one input terminal of the multiplexer 16, and a pressure detection signal V2 output from the operational amplifier 15a is input to the other input terminal of the multiplexer 16. A physical quantity switching signal d2 output from a logic circuit 13d is input to an input switching terminal of the multiplexer 16. An output signal of the multiplexer 16 is input to a terminal VIN of an A/D converter 13c.

The physical quantity sensor 15 detects a temperature-dependent physical quantity, for example, pressure. The multiplexer 16 switches between the divided voltage V1 representing temperature information and the pressure detection signal V2 detected by the physical quantity sensor 15 in a time division manner according to the physical quantity switching signal d2 output from the logic circuit 13d, and outputs the resultant to the A/D converter 13c.

(Pressure Detection by Physical Quantity Sensor)

Figure 8:
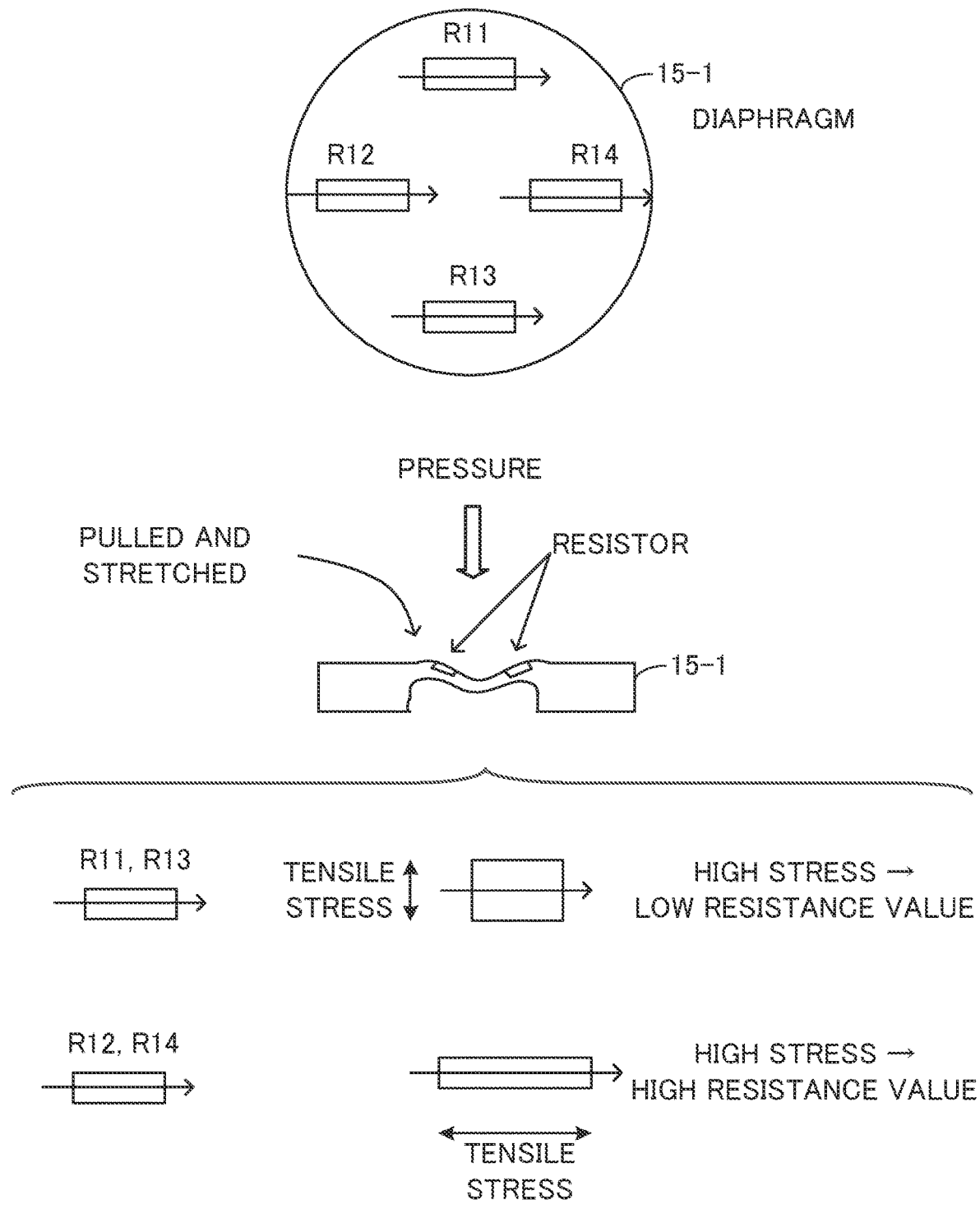
FIG. 8 illustrates the relationship between stress and each Piezo resistor in a physical quantity sensor.

FIG. 8 illustrates the relationship between stress and each Piezo resistor in a physical quantity sensor. The resistors R11, . . . , R14 (Piezo resistors) in the physical quantity sensor 15 form a Wheatstone bridge on a diaphragm 15-1 formed on a semiconductor chip, and a constant current flows from the constant current supply I0 to the resistors R11, . . . , R14. Then, change in the resistances R11 . . . , R14 caused by a deflection of the diaphragm 15-1 due to pressure is amplified by the operational amplifier 15a and is output as an analog value.

More specifically, assume now that a current flows in the arrow directions from the constant current supply I0 to the resistors R11, . . . , R14. When the diaphragm 15-1 deflects downward, i.e., in a downward convex shape, the resistors R11 and R13 are expanded in the width direction of the resistors, so that their current paths widen and their resistance values decrease.

On the other hand, the resistors R12 and R14 are expanded in the flowing direction of the current, so that their current paths lengthen and the resistance values increase. Voltage change due to such changes in the resistance values is amplified by the operational amplifier 15a to detect the pressure.

(Operation of Physical Quantity Sensor Device)

Figure 9:
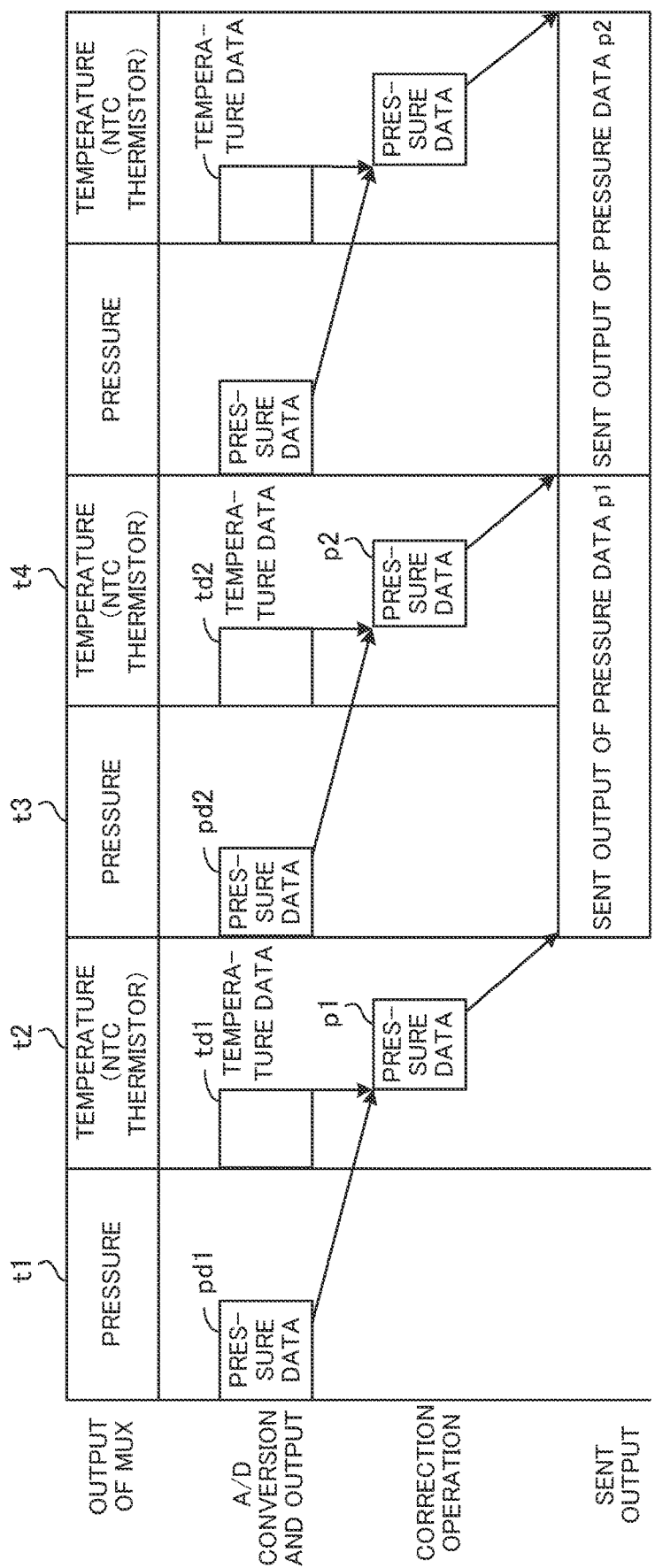
FIG. 9 is a timing chart representing the operation of a physical quantity sensor device.

FIG. 9 is a timing chart representing the operation of a physical quantity sensor device. Before describing an operation timing chart of the present embodiment, an operation timing chart of a device that does not have the function of the present embodiment will be described with reference to FIG. 9 (the operation timing chart of the present embodiment will be described later with reference to FIG. 10).

(Period t1) A multiplexer 16 goes into a state of outputting pressure information according to a physical quantity switching signal d2. An A/D converter 13c performs A/D conversion of a pressure detection signal V2 detected by a physical quantity sensor 15 in a high bit count mode, and outputs pressure data pd1 obtained by the A/D conversion.

(Period t2) The multiplexer 16 goes into a state of outputting temperature information according to the physical quantity switching signal d2. The A/D converter 13c performs A/D conversion of a divided voltage V1 generated by a NTC thermistor Rt and a fixed series resistor in the high bit count mode, and outputs temperature data td1 obtained by the A/D conversion. Then, a logic circuit 13d performs a correction operation of temperature characteristics using the pressure data pd1, temperature data td1, and correction coefficients stored in a memory 13e to thereby generate corrected pressure data p1.

(Period t3) The encoder 13f converts the pressure data p1 into a SENT protocol format, and the output buffer 14 starts to output the pressure data p1 using the SENT protocol.

Meanwhile, the multiplexer 16 goes into a state of outputting pressure information according to the physical quantity switching signal d2. The A/D converter 13c performs A/D conversion of a pressure detection signal V2 detected by the physical quantity sensor 15 in the high bit count mode, and outputs pressure data pd2 obtained by the A/D conversion.

(Period t4) The multiplexer 16 goes into a state of outputting temperature information according to the physical cal quantity switching signal d2. The A/D converter 13c performs A/D conversion of a divided voltage V1 generated by the NTC thermistor Rt and fixed series resistor in the high bit count mode, and outputs temperature data td2 obtained by the A/D conversion. In addition, the logic circuit 13d performs a correction operation of temperature characteristics using the pressure data pd2, temperature data td2, and correction coefficients stored in the memory 13e to thereby generate corrected pressure data p2.

Meanwhile, the output of the pressure data p1 is completed. The encoder 13f converts the pressure data p2 into the SENT protocol format, and the output buffer 14 starts to output the pressure data p2 using the SENT protocol. The same processing as above is repeated hereafter.

Figure 10:
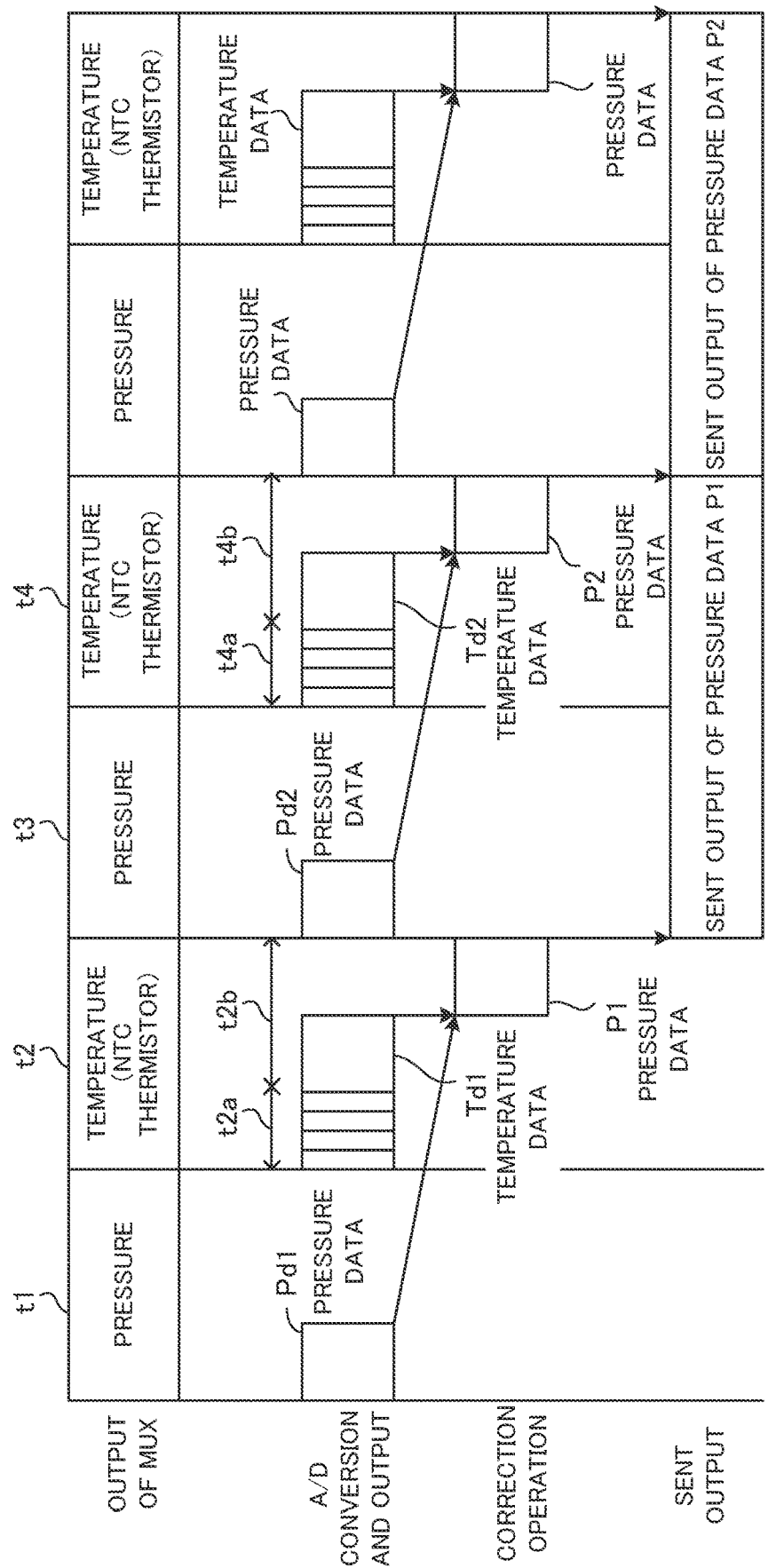
FIG. 10 is a timing chart representing the operation of a physical quantity sensor device.

FIG. 10 is a timing chart representing the operation of the physical quantity sensor device, i.e., an operation timing chart of the physical quantity sensor device 10a of the present embodiment illustrated in FIG. 7.

(Period t1) The multiplexer 16 goes into a state of outputting pressure information according to a physical quantity switching signal d2. The A/D converter 13c performs A/D conversion of a pressure detection signal V2 (a physical quantity detection signal) detected by the physical quantity sensor 15 in a high bit count mode, and outputs pressure data Pd1 (first physical quantity detection data) obtained by the A/D conversion.

(Period t2) The multiplexer 16 goes into a state of outputting temperature information according to the physical quantity switching signal d2.

(Period t2a) The A/D converter 13c is set to a low bit count mode according to a bit count switching signal d1, and outputs first temperature data obtained by performing A/D conversion of a divided voltage V1 in the low bit count mode. The series resistor determination circuit 13a makes a determination to select an optimal series resistor such that first temperature data falls within an unsaturated temperature-dependence region, in order to thereby select the optimal series resistor.

(Period t2b) The A/D converter 13c is set to the high bit count mode according to the bit count switching signal d1, performs A/D conversion of a divided voltage V1 generated by the NTC thermistor Rt and selected optimal series resistor, and outputs temperature data Td1 (second temperature data) obtained by the A/D conversion.

The logic circuit 13d performs a correction operation of temperature characteristics using the pressure data Pd1, temperature data Td1, and correction coefficients stored in the memory 13e to thereby generate corrected pressure data P1 (second physical quantity detection data).

(Period t3) The encoder 13f converts the pressure data P1 into the SENT protocol format, and the output buffer 14 starts to output the voltage data P1 using the SENT protocol.

Meanwhile, the multiplexer 16 goes into a state of outputting pressure information according to the physical quantity switching signal d2. The A/D converter 13c performs A/D conversion of a pressure detection signal V2 detected by the physical quantity sensor 15 in the high bit count mode, and outputs pressure data Pd2 obtained by the A/D conversion.

(Period t4) The multiplexer 16 goes into a state of outputting temperature information according to the physical cal quantity switching signal d2.

(Period t4a) The A/D converter 13c is set to the low bit count mode according to the bit count switching signal d1 and outputs first temperature data obtained by performing A/D conversion of a divided voltage V1 in the low bit count mode. The series resistor determination circuit 13a makes a determination to select an optimal series resistor such that first temperature data falls within the unsaturated temperature-dependence region, in order to thereby select the optimal series resistor.

(Period t4b) The A/D converter 13c is set to the high bit count mode according to the bit count switching signal d1, performs A/D conversion of a divided voltage V1 generated by the NTC thermistor Rt and selected optimal series resistor, and outputs temperature data Td2 obtained by the A/D conversion.

In addition, the logic circuit 13d performs a correction operation of temperature characteristics using the pressure data Pd2, temperature data Td2, and correction coefficients stored in the memory 13e to thereby generate corrected pressure data P2.

Meanwhile, the output of the pressure data P1 is competed. The encoder 13f converts the pressure data P2 into the SENT protocol format, and the output buffer 14 starts to output the pressure data P2 using the SENT protocol. The same processing as above is repeated hereafter.

As described above, in the present embodiment, the logic circuit 13d sequentially obtains pressure data and temperature data depending on the switching of a physical quantity of the multiplexer 16, and performs the correction operation of the pressure data on the basis of the temperature data and correction coefficients. Then, the corrected pressure data is converted into the SENT format and is sent to the ECU, for example.

In this case, the temperature data is obtained in accordance with the flowchart of FIG. 6. More specifically, the A/D converter 13c is controlled to operate in the low bit count mode, and a series resistor is selected. After an optimal series resistor is selected, the A/D converter 13c is controlled to operate in the high bit count mode to obtain temperature data. Therefore, as compared with the case where the A/D converter always operates in a high bit count mode as illustrated in FIG. 9, the physical quantity sensor device 10a is able to perform processes from selection of an optimal series resistor to acquisition of temperature data efficiently in short time.

For example, the SENT protocol regulates the transmission time for a single message. Hence, the A/D converter that always operates in a high bit count mode as illustrated in FIG. 9 is not able to make time to select an optimal series resistor or thus to have the function of selecting a series resistor. By contrast, in the present embodiment in which the A/D converter operates in a low bit mode during selection of an optimal series resistor, it is possible to use a region with high temperature dependence (leading to a high accuracy) of divided voltage by selecting the optimal series resistor, and thus to correct the temperature characteristics with high accuracy.

(Correction Operation)

The following describes a correction operation. For example, the following correction operation as described in Japanese Laid-open Patent Publication No. 2018-119972 may be used for the correction operation of a temperature-dependent physical quantity.

Figure 11:
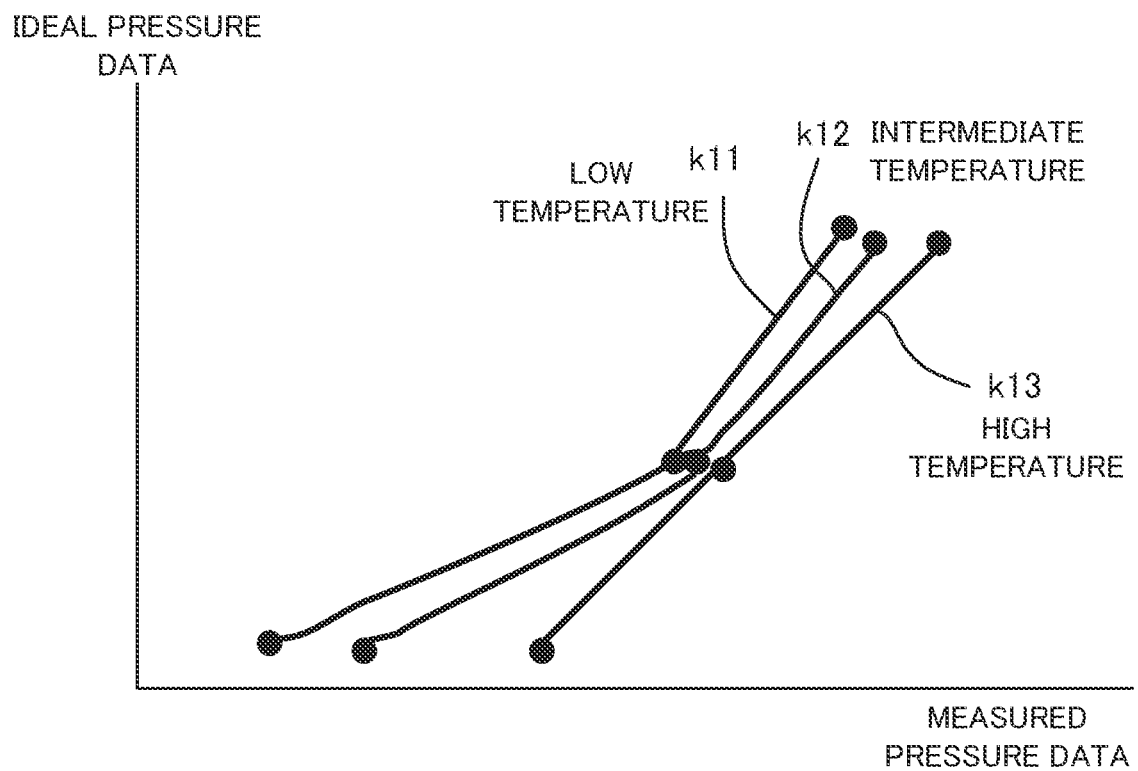
FIG. 11 illustrates the relationship between ideal pressure data and measured pressure data.

FIG. 11 illustrates the relationship between ideal pressure data and measured pressure data. The vertical axis represents ideal pressure data, whereas the horizontal axis represents measured pressure data. The graph k11 represents the relationship between ideal pressure data and measured pressure data at low temperature, the graph k12 represents the relationship between ideal pressure data and measured pressure data at intermediate temperature, and the graph k13 represents the relationship between ideal pressure data and measured pressure data at high temperature.

The graphs k11, k12, and k13 are approximated to quadratic curves using the least-squares method, thereby obtaining equations (1a), (1b), and (1c), respectively. Equation (1a) represents a quadratic curve of the graph k11 at the low temperature, equation (1b) represents a quadratic curve of the graph k12 at the intermediate temperature, and equation (1c) represents a quadratic curve of the graph k13 at the high temperature. In these equations, an, bn, and Cn (n=1, 2, 3) denote correction coefficients.

$$y = a_1 x^2 + b_1 x + c_1 \tag{1a}$$

$$y = a_2 x^2 + b_2 x + c_2 \tag{1b}$$

$$y = a_3 x^2 + b_3 x + c_3 \tag{1c}$$

Figure 12:
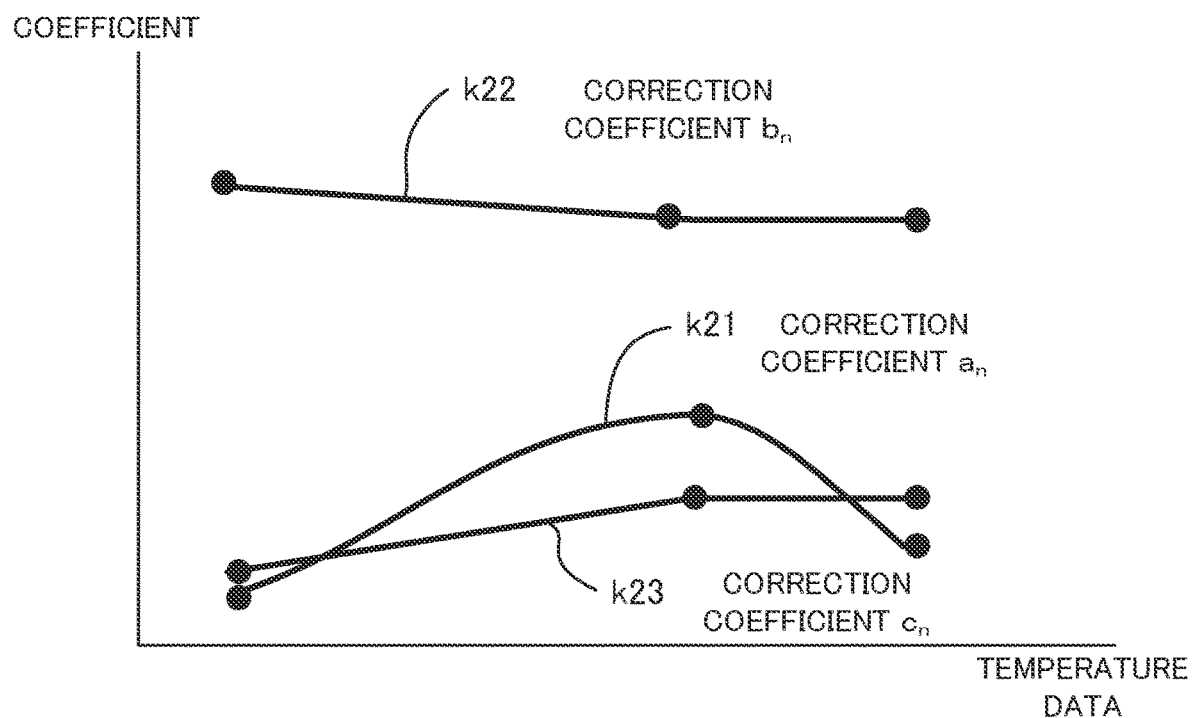
FIG. 12 illustrates the relationship between correction coefficient and temperature data.

FIG. 12 illustrates the relationship between correction coefficient and temperature data. The vertical axis represents correction coefficient value, whereas the horizontal axis represents temperature data. The graph k21 represents changes in temperature data with respect to the correction coefficient an, the graph k22 represents changes in temperature data with respect to the correction coefficient bn, and the graph k23 represents changes in temperature data with respect to the correction coefficient Cn.

These correction coefficients are further approximated to quadratic curves using the least-squares method, thereby obtaining the following equations (2a), (2b), and (2c). Equation (2a) represents a quadratic curve $a_{(Temp)}$ about a quadratic correction coefficient $a_n$, equation (2b) represents a quadratic curve $b_{(Temp)}$ about a linear correction coefficient $b_n$, and equation (2c) represents a quadratic curve $c_{(Temp)}$ about a constant value $c_n$.

$$a_{(Temp)} = a_{T2} x^2 + a_{T1} x + a_{Tc} \tag{2a}$$

$$b_{(Temp)} = b_{T2} x^2 + b_{T1} x + b_{Tc} \tag{2b}$$

$$c_{(Temp)} = c_{T2} x^2 + c_{T1} x + c_{Tc} \tag{2c}$$

Nine correction coefficients obtained from equations (2a), (2b), and (2c) are held. Pressure data is obtained by back calculation. For example, $a_{(Temp)}$, $b_{(Temp)}$, and $c_{(Temp)}$ are calculated from temperature data, and desired pressure data is obtained on the basis of $a_{(Temp)}$, $b_{(Temp)}$, $c_{(Temp)}$, and measured pressure data.

(Variable Control of Operating Voltage Range of A/D Converter Depending on Whether A/D Converter is Low or High Bit Count Mode)

The following describes control of variably switching the operating voltage range of the A/D converter depending on whether the A/D converter is in a low bit count mode or a high bit count mode.

Figure 13:
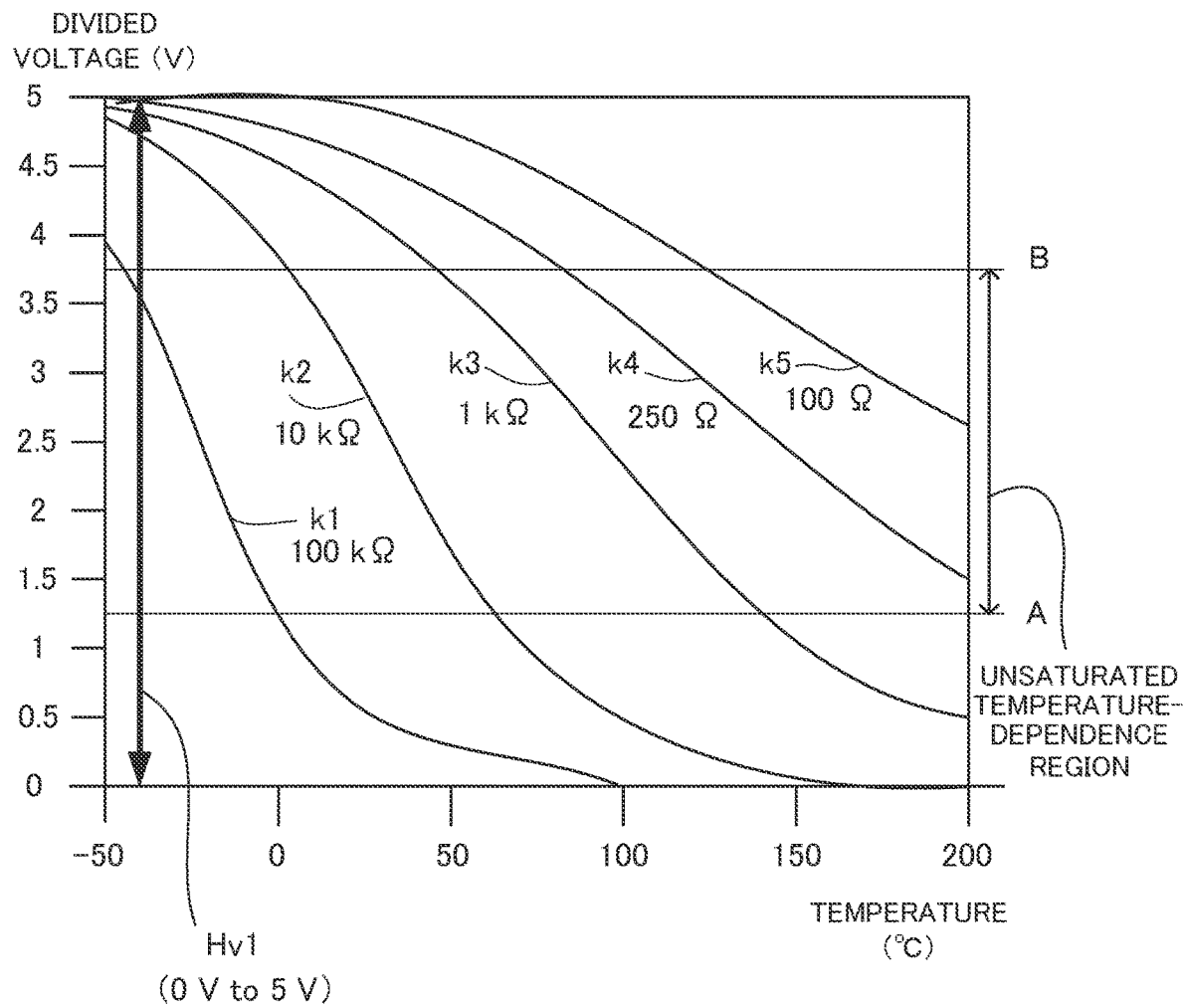
FIG. 13 illustrates an operating voltage range of an analog/digital (A/D) converter.

FIG. 13 illustrates an operating voltage range of the A/D converter. Based on the graph of FIG. 5 representing the temperature dependence of divided voltage for each series resistor, FIG. 13 illustrates an operating voltage range Hv1 of the A/D converter 13c in the semiconductor device 10 illustrated in FIG. 2.

As described earlier, the semiconductor device 10 controls the A/D converter 13c to operate in a low bit count mode during a period of selecting an optimal series resistor, and controls the A/D converter 13c to operate in a high bit count mode after selecting the optimal series resistor.

For this control in the semiconductor device 10, the operating voltage range Hv1 of the A/D converter 13c is set to a range from the reference power supply voltage (for example, GND (0 V)) input to the reference power supply terminal VSS to the reference voltage VREF (for example, 5 V) generated by the reference voltage generation circuit 11a.

That is, in the semiconductor device 10, the A/D conversion is performed in the same operating voltage range Hv1 of 0 V to 5 V in both the low bit count mode and the high bit count mode.

However, when the A/D converter 13c operates in the high bit count mode after selecting an optimal series resistor whose resistance value is such as to generate a divided voltage falling within the unsaturated temperature-dependence region between the threshold A and the threshold B, a voltage in the range of the threshold A to threshold B may be input as an operating voltage to the A/D converter 13c.

Assume now that the A/D converter 13c has a 12-bit resolution. In this case, there are 4096 ($=2^{12}$) levels, each of which has a voltage range (quantization error) of 1.2 mV ($=5÷4096$).

In the case where the threshold A is set to a voltage of 1.25 V, the threshold B is set to a voltage of 3.75 V, and the A/D converter 13c operates in the high bit count mode, the levels of 0 to 1023 least significant bytes (LSB) corresponding to 0 V to 1.25 V and the levels of 3072 to 4095 LSB corresponding to 3.75 V to 5 V are not used in the first place.

Therefore, when the A/D converter 13c operates in the high bit count mode, an operating voltage in the range Hv1 of 0 V to 5 V does not need to be input to the A/D converter 13c, but a voltage in the range of the threshold A (the lower limit voltage of the predetermined voltage range) to the threshold B (the upper limit voltage of the predetermined voltage range) may be input to the A/D converter 13c as an operating voltage.

For this reason, in the variable control of the operating voltage range of the A/D converter 13c in the present embodiment, the operating voltage range of the operating voltage to be input to the A/D converter 13c is switched efficiently depending on whether the A/D conversion is performed in the low bit count mode or in the high bit count mode.

Figure 14:
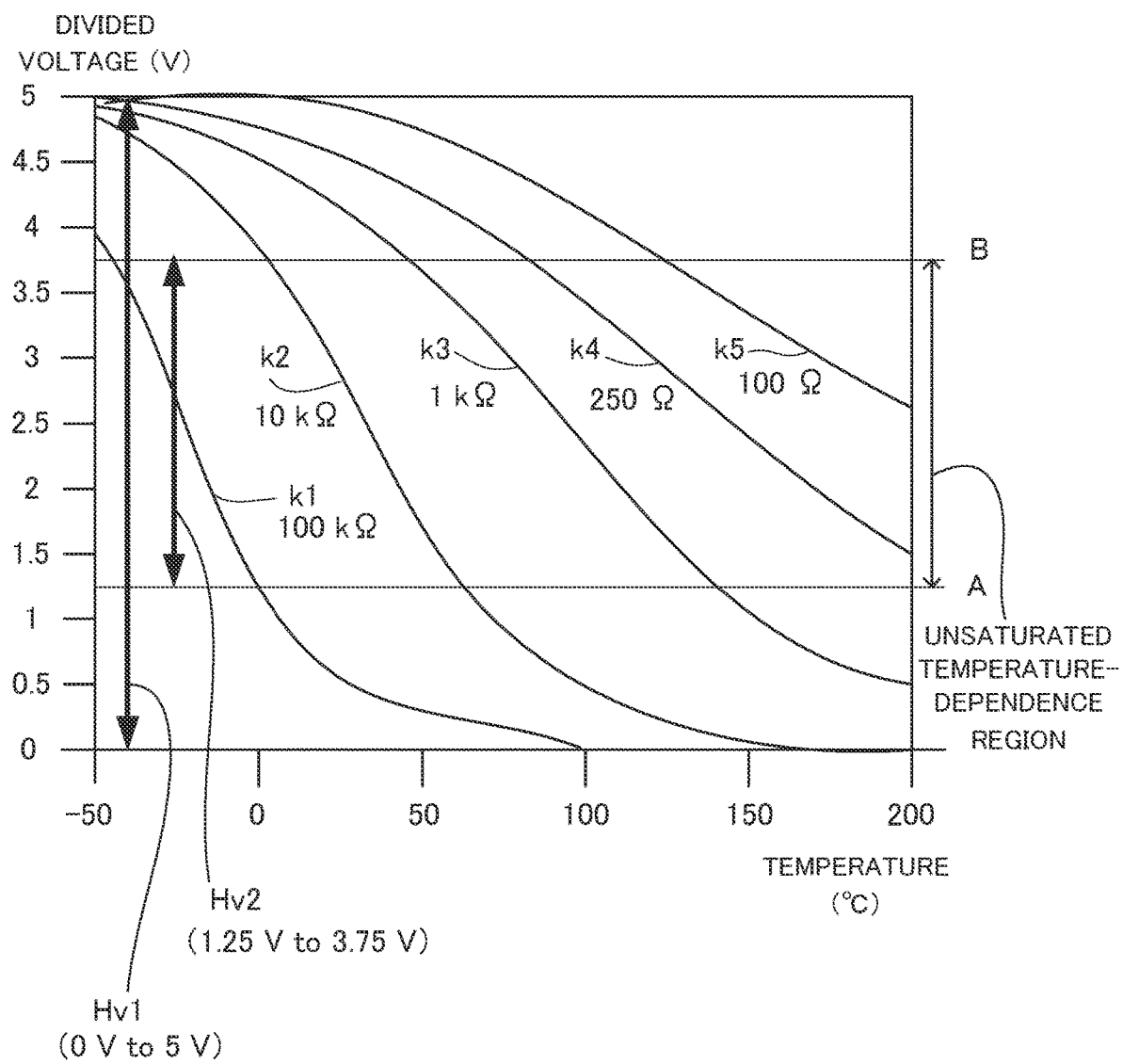
FIG. 14 illustrates operating voltage ranges of an A/D converter.

FIG. 14 illustrates operating voltage ranges of the A/D converter. Based on the graph of FIG. 5 representing the temperature dependence of divided voltage for each series resistor, FIG. 14 illustrates operating voltage ranges Hv1 and Hv2 of the A/D converter 13c that are switched depending on whether the A/D converter 13c is in the low or high bit count mode.

Control is exercised as follows: when the A/D converter 13c operates in the low bit count mode, an operating voltage in the range Hv1 of 0 V to 5 V is input to the A/D converter 13c; and when the A/D converter 13c operates in the high bit count mode, an operating voltage in the range Hv2 of the threshold A to the threshold B (1.25 V to 3.75 V) is input to the A/D converter 13c.

Figure 15:
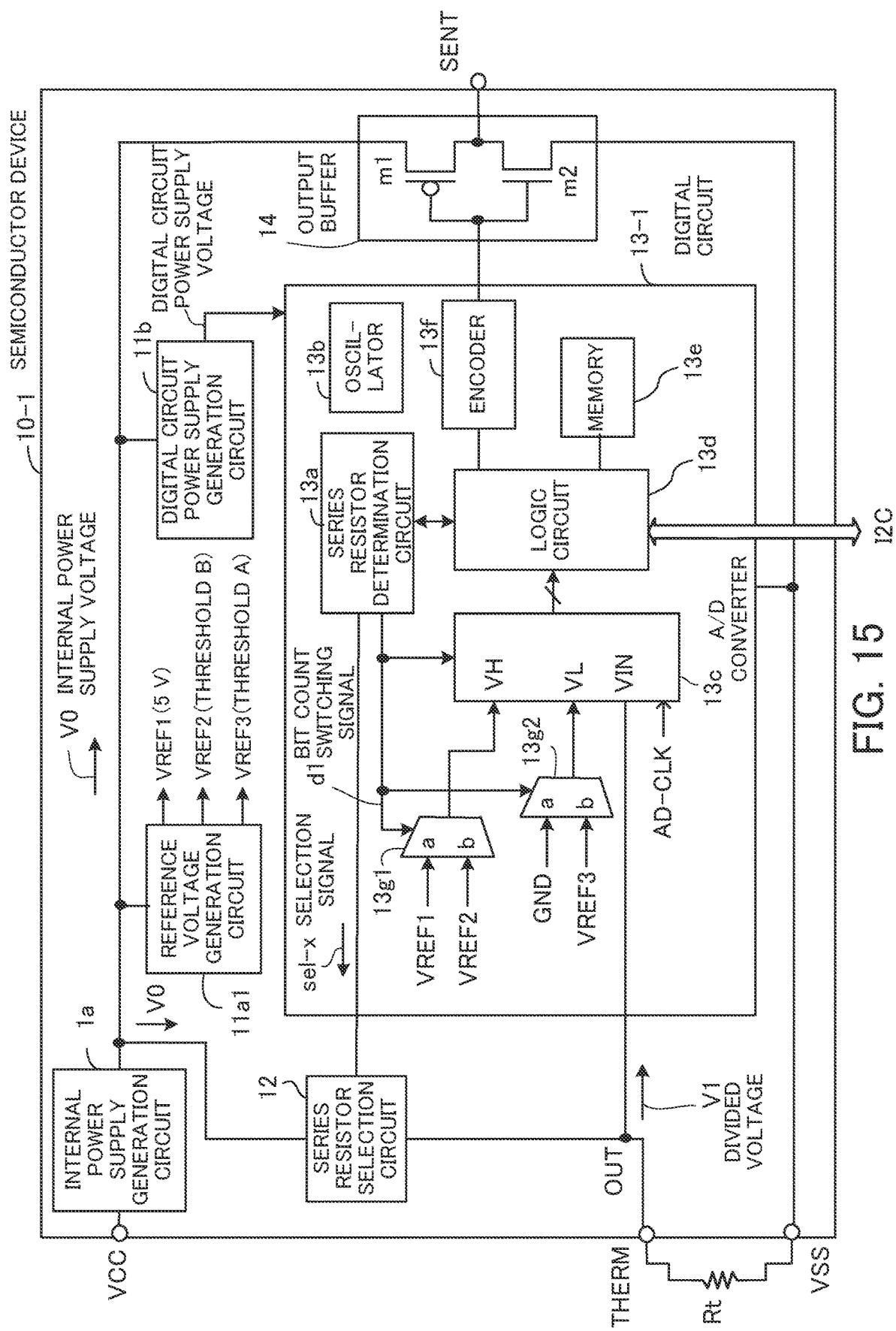
FIG. 15 illustrates an example of the configuration of a semiconductor device.

FIG. 15 illustrates an example of the configuration of a semiconductor device. The semiconductor device 10-1 additionally has a variable control function of variably controlling the operating voltage range of the A/D converter 13c, in addition to the function of the semiconductor device 10 of FIG. 2. The semiconductor device 10-1 includes a reference voltage generation circuit 11a1 and a digital circuit 13-1. The digital circuit 13-1 includes multiplexers 13g1 and 13g2. The other components of the semiconductor device 10-1 are the same as those of the semiconductor device 10 of FIG. 2.

The reference voltage generation circuit 11a1 generates reference voltages VREF1, VREF2, and VREF3 from an internal power supply voltage V0, and supplies the reference voltages VREF1 and VREF2 to the multiplexer 13g1 and the reference voltage VREF3 to the multiplexer 13g2. In this connection, the reference voltage VREF1 is 5 V, for example. In addition, the reference voltage VREF2 is the voltage of the threshold B and is, for example, 3.75 V. The reference voltage VREF3 is the voltage of the threshold A and is, for example, 1.25 V.

The multiplexer 13g1 receives the reference voltage VREF1 at one input terminal a thereof, and receives the reference voltage VREF2 at the other input terminal b thereof. In addition, the multiplexer 13g1 receives a bit count switching signal d1 output from a series resistor determination circuit 13a at an input switching terminal thereof. An output signal of the multiplexer 13g1 is input to a terminal VH (high potential-side operating voltage input terminal) of an A/D converter 13c.

One input terminal a of the multiplexer 13g2 is connected to the GND. The reference voltage VREF3 is input to the other input terminal b of the multiplexer 13g2. In addition, the bit count switching signal d1 output from the series resistor determination circuit 13a is input to an input switching terminal of the multiplexer 13g2. An output signal of the multiplexer 13g2 is input to a terminal VL (low potential-side operational voltage input terminal) of the A/D converter 13c.

(Operating Voltage Range of A/D converter 13c in Low Bit Count Mode)

The series resistor determination circuit 13a sends a bit count switching signal d1 to the A/D converter 13c to set the bit count mode of the AD converter 13c to a low bit count mode. The multiplexer 13g1, when receiving the bit count switching signal d1 for setting the low bit count mode, selects the reference voltage VREF1 (5 V) input to the input terminal a and outputs the reference voltage VREF1 (5 V) to the terminal VH of the A/D converter 13c.

In addition, the multiplexer 13g2, when receiving the bit count switching signal d1 for setting the low bit count mode, selects the GND (0 V) input to the input terminal a and outputs 0 V to the terminal VL of the A/D converter 13c. As a result, when operating in the low bit count mode, the A/D converter 13c performs A/D conversion at an operating voltage in the range of 0 V to 5 V (the range Hv1 of FIG. 14).

(Operating Voltage Range of A/D Converter 13c in High Bit Count Mode)

After selecting an optimal series resistor, the series resistor determination circuit 13a sends a bit count switching signal d1 to the A/D converter 13c to set the bit count mode of the A/D converter 13c to a high bit count mode. The multiplexer 13g1, when receiving the bit count switching signal d1 for setting the high bit count mode, selects the reference voltage VREF2 (3.75 V: threshold B) input to the input terminal b, and outputs the reference voltage VREF2 (3.75 V: threshold B) to the terminal VH of the A/D converter 13c.

In addition, the multiplexer 13g2, when receiving the bit count switching signal d1 for setting the high bit count mode, selects the reference voltage VREF3 (1.25 V: threshold A) input to the input terminal b and outputs the reference voltage VREF3 (1.25 V: threshold A) to the terminal VL of the A/D converter 13c. As a result, when operating in the high bit count mode, the A/D converter 13c performs A/D conversion at an operating voltage in the range of 1.25 to 3.75 V (the range Hv2 of FIG. 14).

Figure 16:
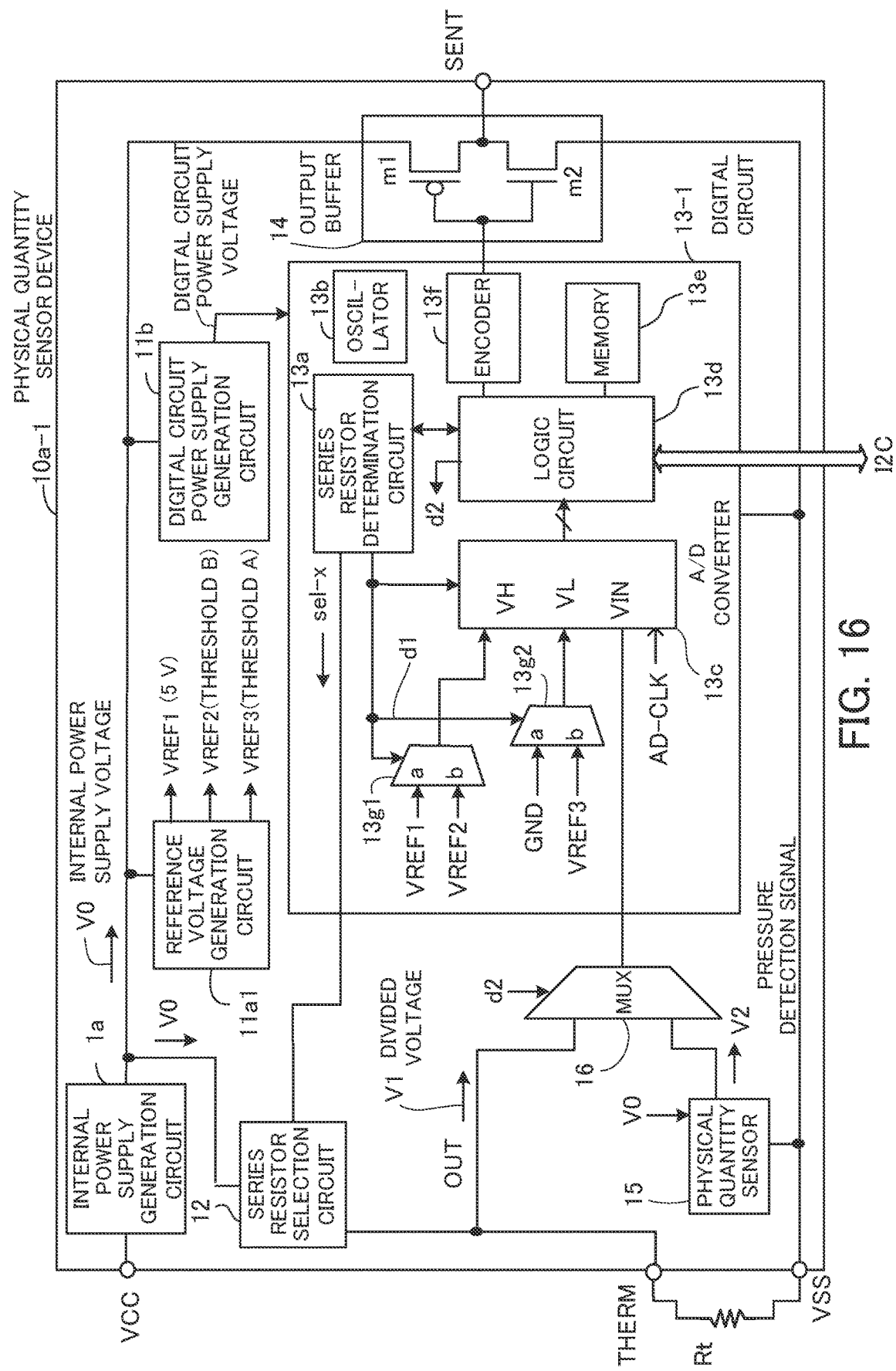
FIG. 16 illustrates an example of the configuration of a physical quantity sensor device.
Figure 17:
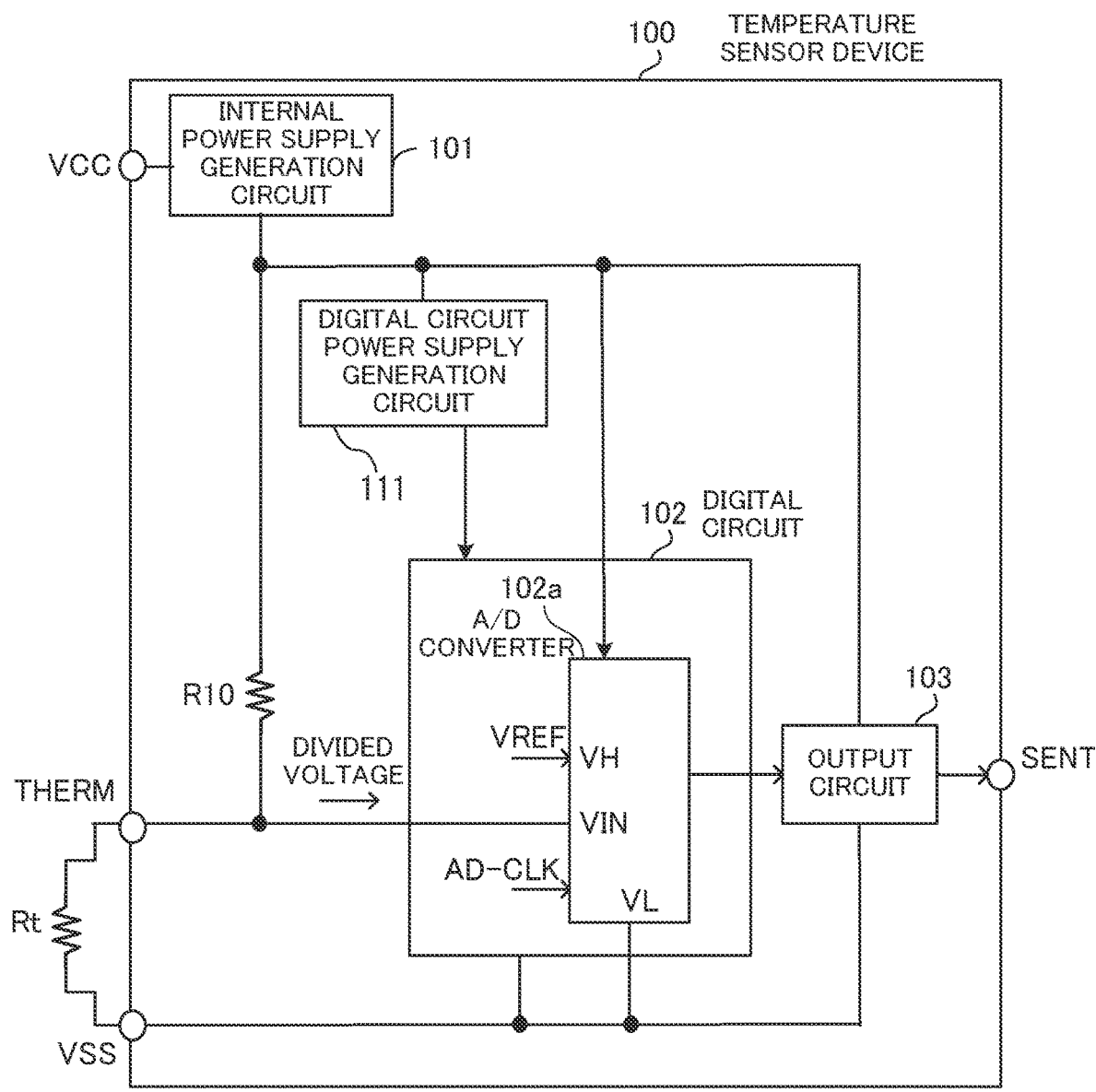
FIG. 17 illustrates the configuration of a conventional temperature sensor device.
Figure 18:
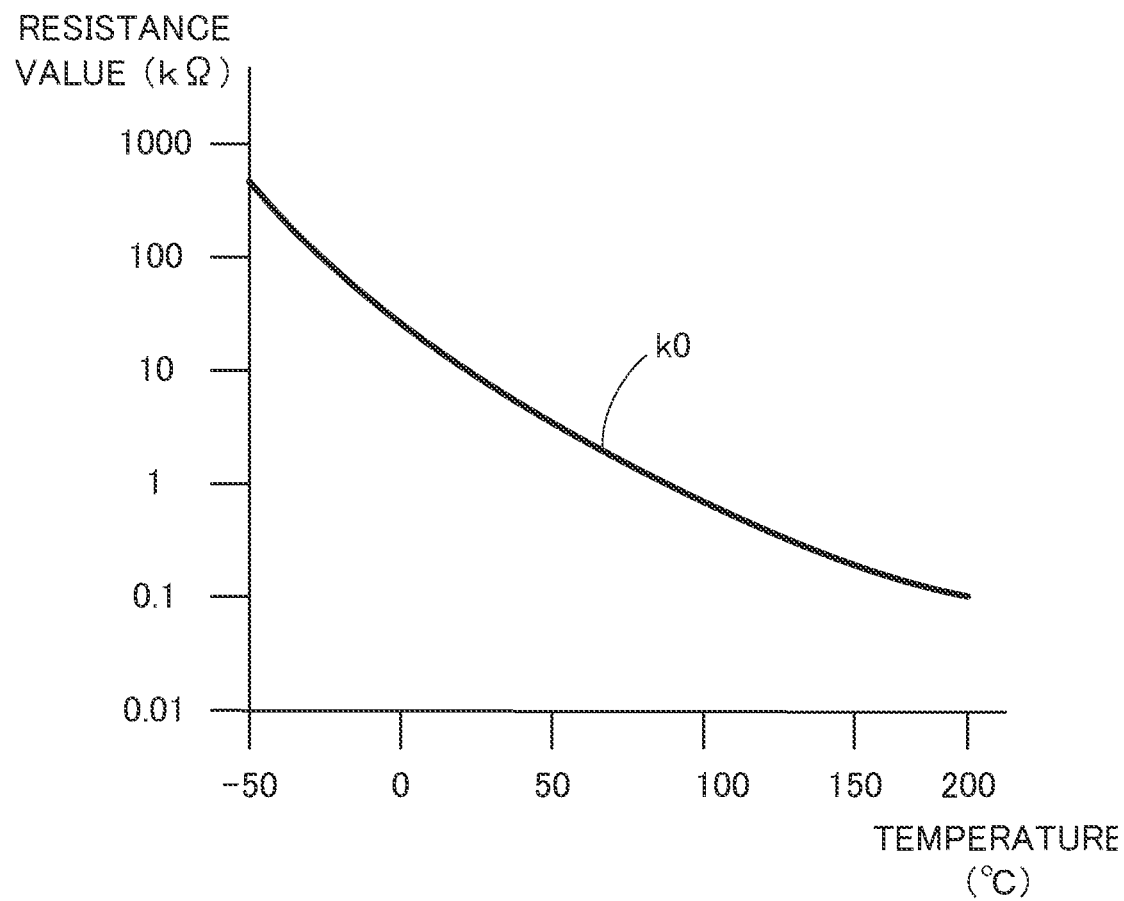
FIG. 18 illustrates the temperature dependence of a negative temperature coefficient (NTC) thermistor.
Figure 19:
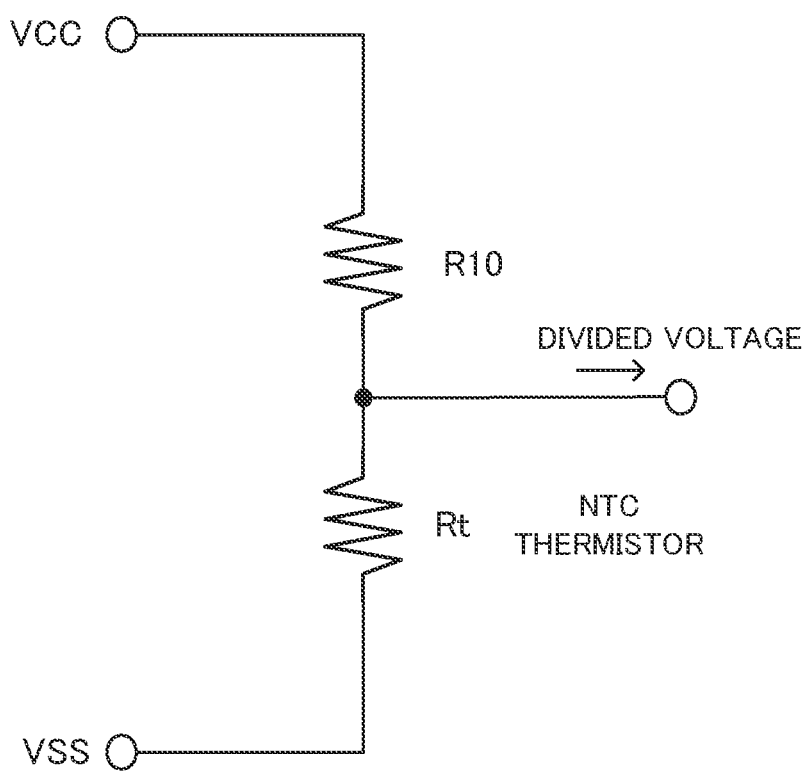
FIG. 19 illustrates an example of a circuit using an NTC thermistor.
Figure 20:
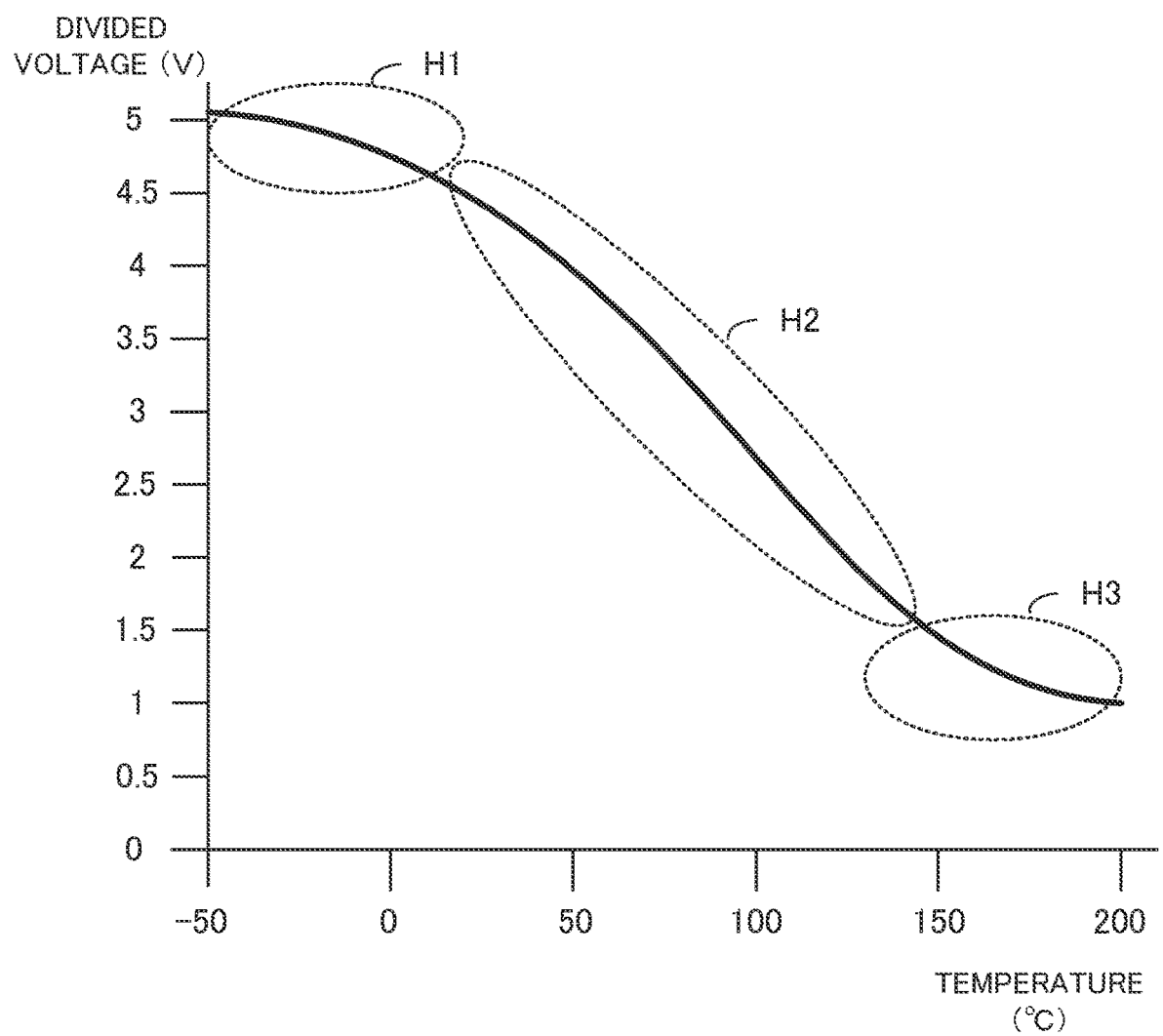
FIG. 20 illustrates the temperature dependence of divided voltage.

FIG. 16 illustrates an example of the configuration of a physical quantity sensor device. The physical quantity sensor device 10a-1 additionally has a variable control function of variably controlling the operating voltage range of the A/D converter 13c, in addition to the function of the physical quantity sensor device 10a of FIG. 7.

The physical quantity sensor device 10a-1 includes a reference voltage generation circuit 11a1 and a digital circuit 13-1. The digital circuit 13-1 includes multiplexers 13g1 and 13g2. The other components of the physical quantity sensor device 10a-1 are the same as those of the physical quantity sensor device 10a of FIG. 7. The switching control of the operating voltage range of the A/D converter 13c depending on whether the A/D converter 13c is in the low or high bit count mode is the same as the switching control described earlier with reference to FIG. 15, and therefore the description thereof will be omitted.

In the semiconductor device 10-1, at the stage of selecting an optimal series resistor from the series resistors that are connected to the NTC thermistor Rt, the A/D conversion needs to be performed in a wide input voltage range for a divided voltage V1 obtained by dividing an internal power supply voltage V0 between the NTC thermistor Rt and a series resistor selected in the series resistor selection circuit 12. In addition, at this stage of selecting the optimal series resistor, the A/D converter 13c operates in a low bit count mode.

Therefore, as described above, in the semiconductor device 10-1, when the A/D converter 13c operates at high speed in the low bit count mode, a voltage lower than the threshold A and a voltage higher than the threshold B are input to the A/D converter 13c to set a wide operating voltage range Hv1 (0 V to 5 V) in the A/D converter 13c.

On the other hand, after selecting the optimal series resistor, it is certain that the divided voltage V1 falls within the range of the threshold A to threshold B that is the unsaturated temperature-dependence region. In addition, after selecting the optimal series resistor, the A/D converter 13c operates in a high bit count mode.

In the semiconductor device 10-1, when the A/D converter 13c operates at low speed in the high bit count mode, the operating voltage range of the A/D converter 13c is narrowed to the range Hv2 of the threshold A to threshold B, as described above. The same control is exercised in the physical quantity sensor device 10a-1.

As described above, according to the present embodiment, the operating voltage range of an A/D converter is variably controlled depending on whether the A/D converter is in a low or high bit count mode. This makes it possible to perform A/D conversion with reducing quantization error and with high accuracy. For example, in the case where the A/D converter 13c has a 12-bit resolution, there are 4096 ($=2^{12}$) levels, and the threshold A is set to a voltage of 1.25 V, and the threshold B is set to a voltage of 3.75 V.

In this case, when the A/D converter 13c operates in the high bit count mode, each level has a voltage range (quantization error) of 0.6 mV (=(3.75 V−1.25 V)÷4096), and thus the resolution of the A/D converter 13c is double the resolution obtained in the earlier-described case of 1.2 mV (=5÷4096).

Heretofore, the embodiment has been described. Each component in the embodiment may be replaced with another component having an equivalent function. In addition, other desired configurations and steps may be added. In addition, two or more desired configurations (features) in the embodiment may be combined.

According to one aspect, it is possible to reduce time to select a series resistor with an optimal resistance value from series resistors that are connected to a thermistor, and also to improve the measurement accuracy by obtaining measurement target data using the resistance value of the selected series resistor.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   a thermistor for temperature detection;
   a series resistor selection circuit including a series resistor group that is connected in series with the thermistor, the series resistor selection circuit being configured to select a series resistor from the series resistor group according to a selection signal;
   an analog/digital (A/D) converter that performs A/D conversion on a divided voltage obtained by dividing an internal power supply voltage between the thermistor and the selected series resistor to generate divided voltage data, and outputs the divided voltage data; and
   a control circuit that
      during a period of selecting the series resistor, controls the A/D converter to operate in a low bit count mode, such that the selected series resistor causes the divided voltage data to fall within a predetermined voltage range, and
      controls the A/D converter to operate in a high bit count mode after selecting the series resistor.

2. The semiconductor device according to claim 1, wherein the predetermined voltage range corresponds to an unsaturated region, which is a region of a divided-voltage temperature dependence graph in which divided-voltage temperature dependence is not saturated in a target temperature range.

3. The semiconductor device according to claim 1, wherein the series resistor selection circuit further includes a switch group that selects the series resistor from the series resistor group according to the selection signal.

4. The semiconductor device according to claim 3, wherein
   the series resistor group includes a plurality of series resistors including a first series resistor and a second series resistor, the second series resistor having a resistance value that is equal to a resistance value of the first series resistor multiplied by 2 or the power of 2, and
   the switch group selects a set of series resistors from the plurality of series resistors according to the selection signal.

5. The semiconductor device according to claim 1, further comprising an output unit that
   converts the divided voltage data output from the A/D converter operating in the high bit count mode after selecting the series resistor, in accordance with a communication protocol, and
   outputs the converted divided voltage data.

6. The semiconductor device according to claim 5, wherein the communication protocol is one of a single edge nibble transmission (SENT) protocol, a peripheral sensor interface 5 (PSI5) protocol, and a distributed system interface (DSI) protocol.

7. The semiconductor device according to claim 1, wherein the A/D converter has an A/D conversion function of a successive approximation register type or a delta-sigma type.

8. The semiconductor device according to claim 1, wherein the A/D converter operates in the high bit count mode to have a first operating voltage range, and operates in the low bit count mode to have a second operating voltage range, and the control circuit sets the first operating voltage range to be narrower than the second operating voltage range.

9. The semiconductor device according to claim 8, wherein the control circuit inputs an upper limit voltage and a lower limit voltage of the predetermined voltage range to the A/D converter to set the first operating voltage range, and inputs a voltage higher than the upper limit voltage and a voltage lower than the lower limit voltage to the A/D converter to set the second operating voltage range.

10. A physical quantity sensor device, comprising:
a thermistor for temperature detection;
a physical quantity sensor that detects a physical quantity and outputs a physical quantity detection signal;
a series resistor selection circuit including a series resistor group that is connected in series with the thermistor, the series resistor selection circuit being configured to select a series resistor from the series resistor group according to a selection signal;
a multiplexer that outputs one of
  a divided voltage obtained by dividing an internal power supply voltage between the thermistor and the selected series resistor, and
  the physical quantity detection signal,
by switching between the divided voltage and the physical quantity detection signal according to a switching signal;
an analog/digital (A/D) converter that performs A/D conversion on the divided voltage or the physical quantity detection signal output from the multiplexer; and
a control circuit that
  causes the multiplexer to output the physical quantity detection signal according to the switching signal, and controls the A/D converter to perform the A/D conversion on the physical quantity detection signal in a high bit count mode, to thereby obtain first physical quantity detection data,
  during period of selecting the series resistor, causes the multiplexer to output the divided voltage according to the switching signal, and controls the A/D converter to perform the A/D conversion on the divided voltage in a low bit count mode to thereby obtain first temperature data, such that the divided voltage falls within a predetermined voltage range,
  after selecting the series resistor, controls the A/D converter to perform the A/D conversion on the divided voltage in the high bit count mode, to thereby obtain second temperature data, and
  processes the first physical quantity detection data using the second temperature data and a correction coefficient to generate second physical quantity detection data.

11. The physical quantity sensor device according to claim 10, wherein the predetermined voltage range corresponds to an unsaturated region, which is a region of a divided-voltage temperature dependence graph in which divided-voltage temperature dependence is not saturated in a target temperature range.

12. The physical quantity sensor device according to claim 10, wherein the physical quantity detected by the physical quantity sensor is pressure, which is temperature dependent.

13. The physical quantity sensor device according to claim 10, wherein the series resistor selection circuit further includes a switch group that selects the series resistor from the series resistor group according to the selection signal.

14. The physical quantity sensor device according to claim 13, wherein the series resistor group includes a plurality of series resistors including a first series resistor and a second series resistor, the second series resistor having a resistance value that is equal to a resistance value of the first series resistor multiplied by 2 or the power of 2, and the switch group selects a set of series resistors from the plurality of series resistors according to the selection signal.

15. The physical quantity sensor device according to claim 10, further comprising an output unit that converts the second physical quantity detection data in accordance with a communication protocol, and outputs the converted second physical quantity detection data.

16. The physical quantity sensor device according to claim 15, wherein the communication protocol is one of a single edge nibble transmission (SENT) protocol, a peripheral sensor interface 5 (PSI5) protocol, and a distributed system interface (DSI) protocol.

17. The physical quantity sensor device according to claim 10, wherein the A/D converter has an A/D conversion function of a successive approximation register type or a delta-sigma type.

18. The physical quantity sensor device according to claim 10, wherein the A/D converter operates in the high bit count mode to have a first operating voltage range, and operates in the low bit count mode to have a second operating voltage range, and the control circuit sets the first operating voltage range to be narrower than the second operating voltage range.

19. The physical quantity sensor device according to claim 18, wherein the control circuit inputs an upper limit voltage and a lower limit voltage of the predetermined voltage range to the A/D converter to set the first operating voltage range, and inputs a voltage higher than the upper limit voltage and a voltage lower than the lower limit voltage to the A/D converter to set the second operating voltage range.

* * * * *